(12) United States Patent
Lee

(10) Patent No.: US 7,547,669 B2
(45) Date of Patent: *Jun. 16, 2009

(54) REMOVER COMPOSITIONS FOR DUAL DAMASCENE SYSTEM

(75) Inventor: Wai Mun Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 608 days.

This patent is subject to a terminal disclaimer.

(21) Appl. No.: 11/119,844

(22) Filed: May 2, 2005

(65) Prior Publication Data

US 2005/0266683 A1   Dec. 1, 2005

Related U.S. Application Data

(60) Continuation-in-part of application No. 10/689,657, filed on Oct. 22, 2003, now Pat. No. 7,135,445, which is a continuation-in-part of application No. 10/007,134, filed on Dec. 4, 2001, now Pat. No. 7,157,415, which is a division of application No. 09/343,532, filed on Jun. 30, 1999, now Pat. No. 6,417,112.

(60) Provisional application No. 60/623,190, filed on Oct. 29, 2004, provisional application No. 60/092,024, filed on Jul. 6, 1998.

(51) Int. Cl.
*C11D 7/50* (2006.01)
(52) U.S. Cl. .................................. 510/175; 134/1.3
(58) Field of Classification Search ............ 510/175; 134/1.3
See application file for complete search history.

(56) References Cited

U.S. PATENT DOCUMENTS

| 4,172,005 A | 10/1979 | Muraoka et al. |
| 4,239,661 A | 12/1980 | Muraoka et al. |
| 4,294,911 A | 10/1981 | Guild |
| 4,339,340 A | 7/1982 | Muraoka et al. |

(Continued)

FOREIGN PATENT DOCUMENTS

JP    62-281332    7/1987

(Continued)

OTHER PUBLICATIONS

U.S. Appl. No. 10/689,657, filed Oct. 22. 2003, Arkless et al.

(Continued)

*Primary Examiner*—Gregory E Webb
(74) *Attorney, Agent, or Firm*—Morgan Lewis & Bockius LLP

(57) ABSTRACT

A new remover chemistry based on a choline compound, such as choline hydroxide, is provided in order to address problems related to removal of residues, modified photoresists, photoresists, and polymers such as organic anti-reflective coatings and gap-fill and sacrificial polymers from surfaces involved in dual damascene structures without damaging the dielectrics and substrates involved therein. An etch stop inorganic layer at the bottom of a dual damascene structure may or may not be used to cover the underlying interconnect of copper. If not used, a process step of removing that protective layer can be avoided through a timed etch of the via in trench-first dual damascene processes.

9 Claims, 13 Drawing Sheets

U.S. PATENT DOCUMENTS

| | | | |
|---|---|---|---|
| 4,464,461 A | 8/1984 | Guild | |
| 5,635,423 A | 6/1997 | Huang et al. | |
| 5,686,354 A | 11/1997 | Avanzino et al. | |
| 5,705,430 A | 1/1998 | Avanzino et al. | |
| 5,739,579 A | 4/1998 | Chiang et al. | |
| 5,846,695 A | 12/1998 | Iwata et al. | |
| 6,417,112 B1 * | 7/2002 | Peyne et al. | 438/754 |
| 2002/0134963 A1 | 9/2002 | Peyne et al. | |

FOREIGN PATENT DOCUMENTS

| | | |
|---|---|---|
| JP | 01-191450 | 1/1989 |
| JP | 02-275631 | 9/1990 |
| JP | 06-041773 | 2/1994 |
| JP | 06-163495 | 10/1994 |

OTHER PUBLICATIONS

U.S. Appl. No. 10/007,134, filed Dec. 4, 2001, Arkless et al.
U.S. Appl. No. 09/343,532, filed Jun. 30, 1999, Arkless et al.
U.S. Appl. No. 60/092,024, filed Jul. 6, 1998, Arkless et al.
U.S. Appl. No. 60/623,190, filed Oct. 29, 2004, Lee.

* cited by examiner

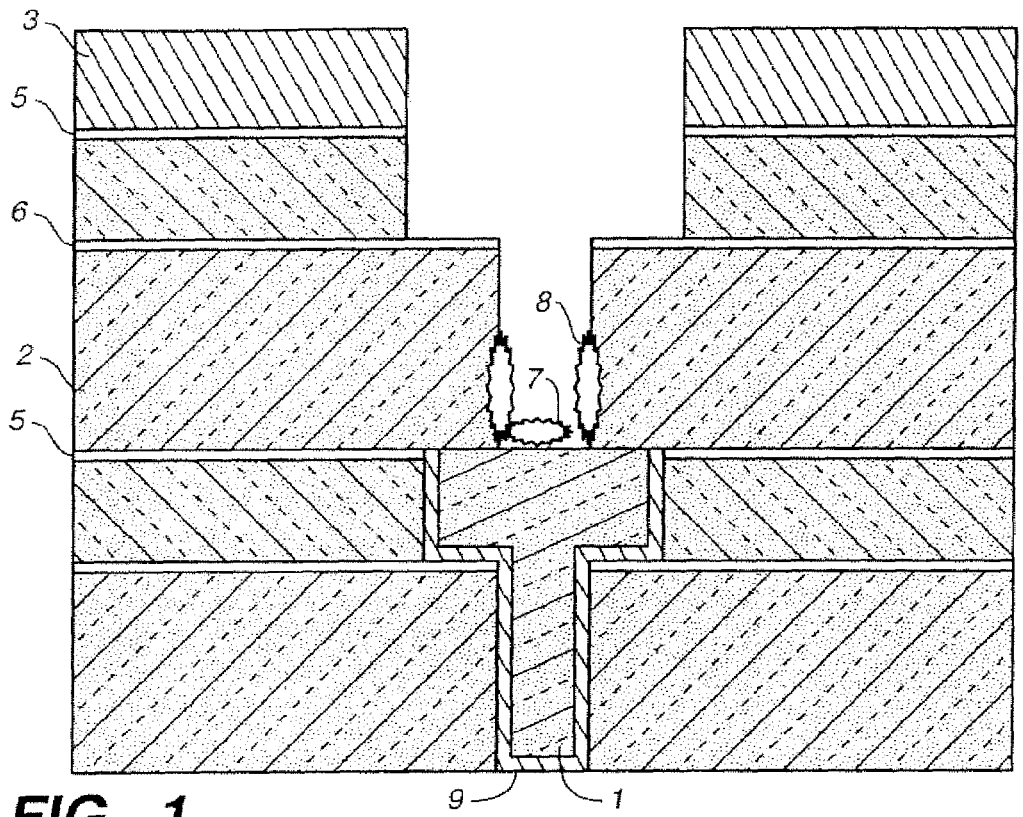
FIG._1
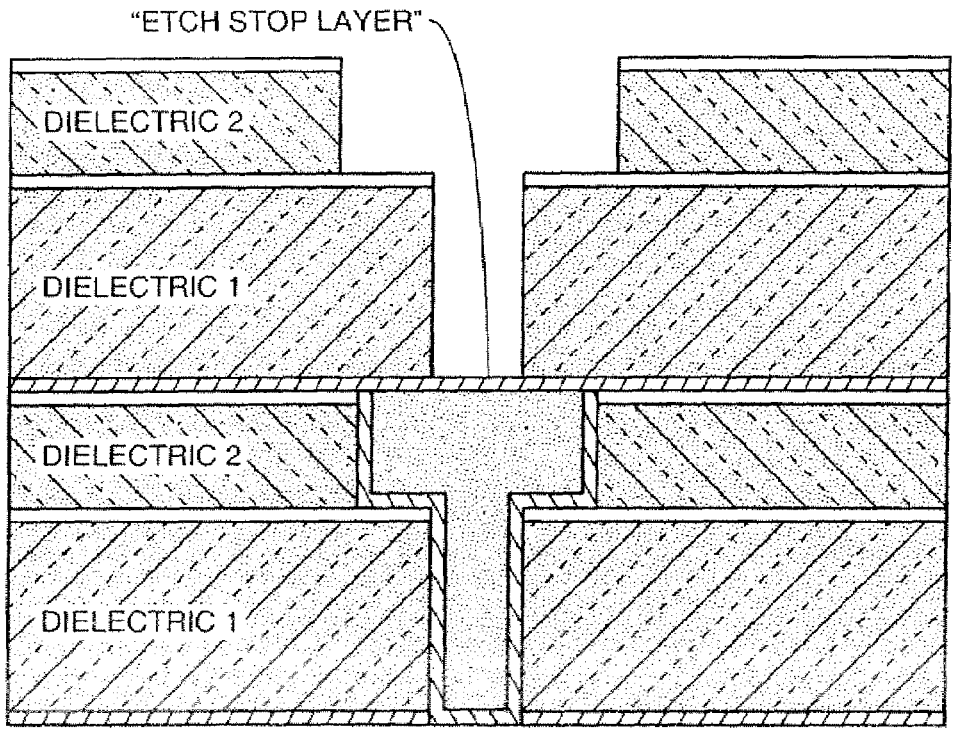
FIG._2

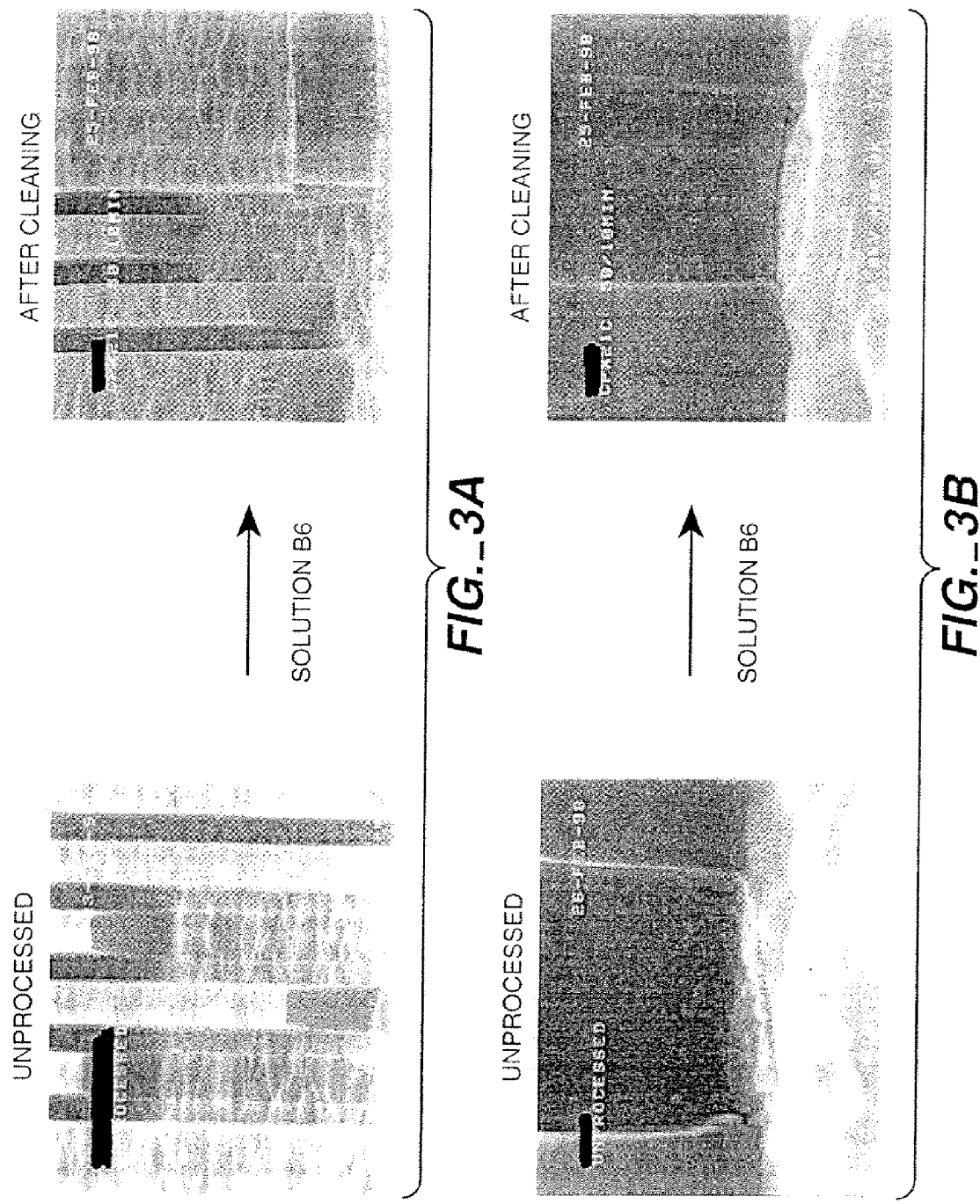

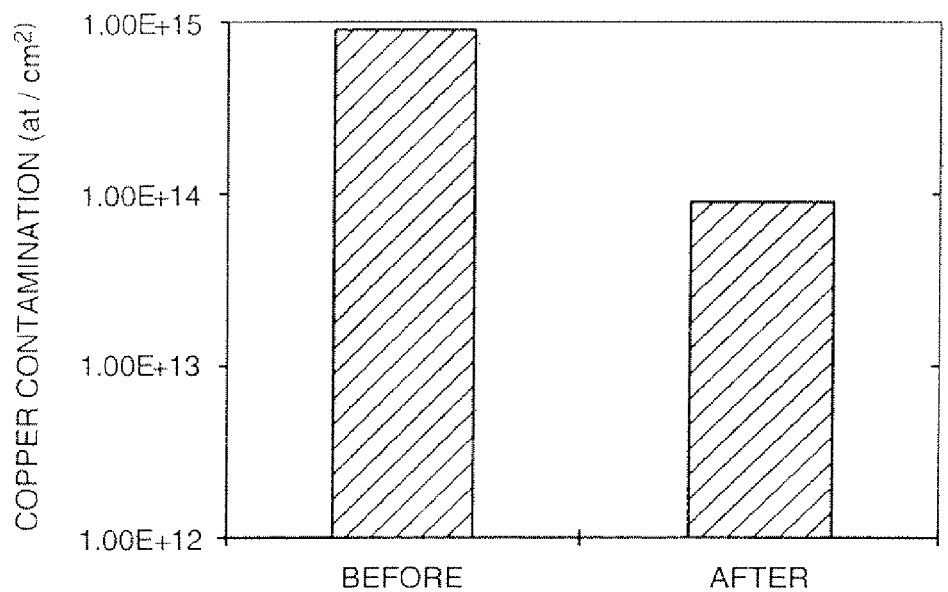
FIG._4
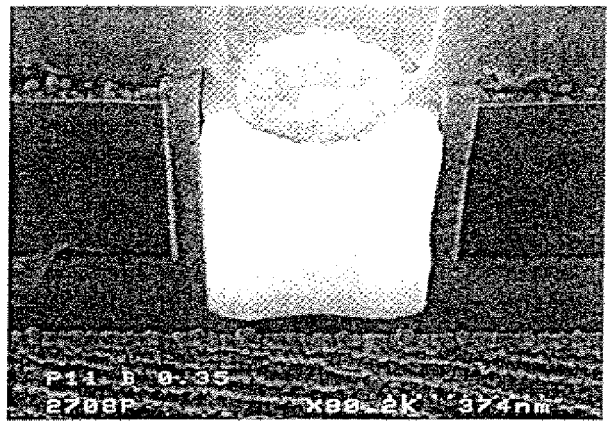
FIG._5
FIG._6

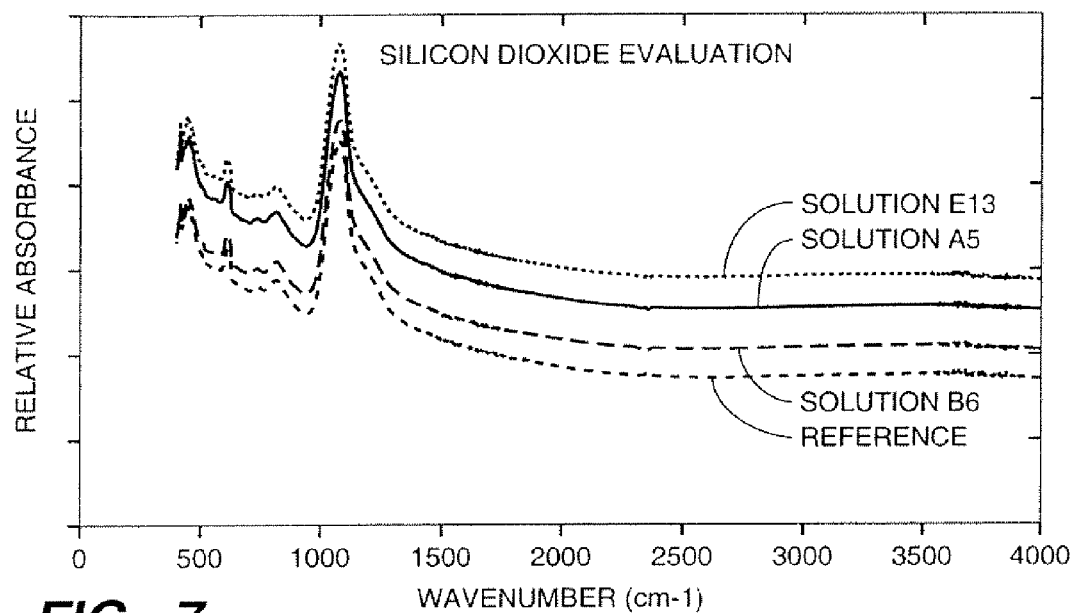
FIG._7
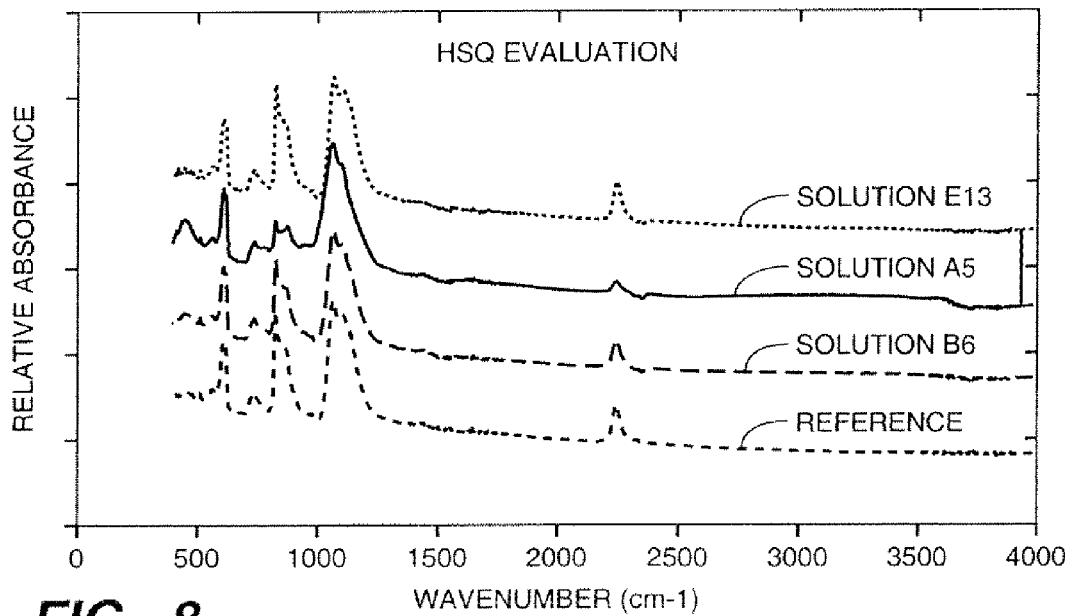
FIG._8

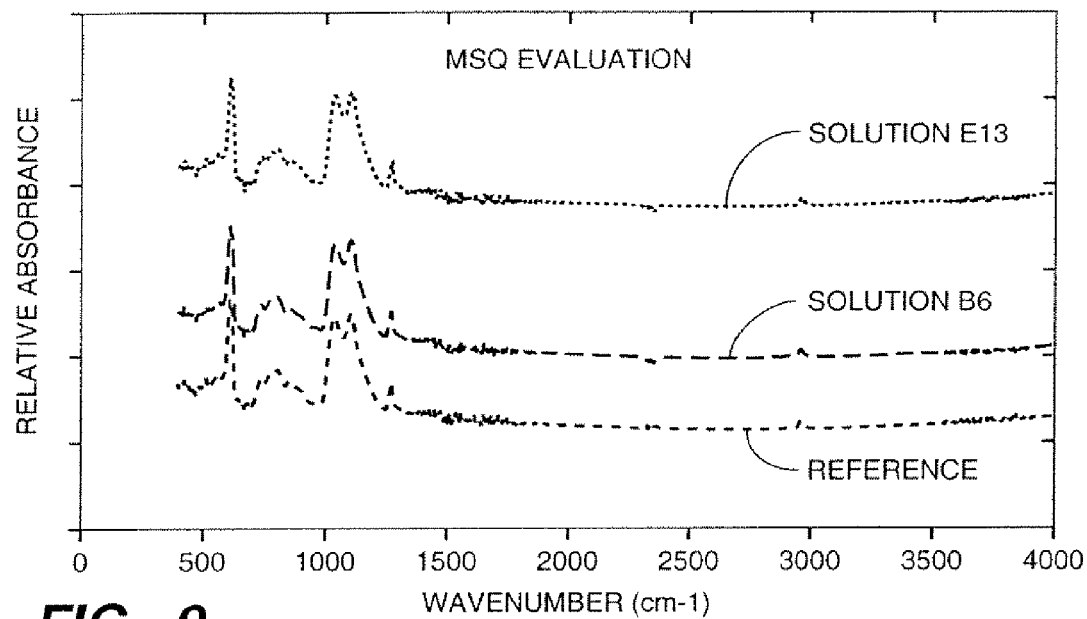
FIG._9
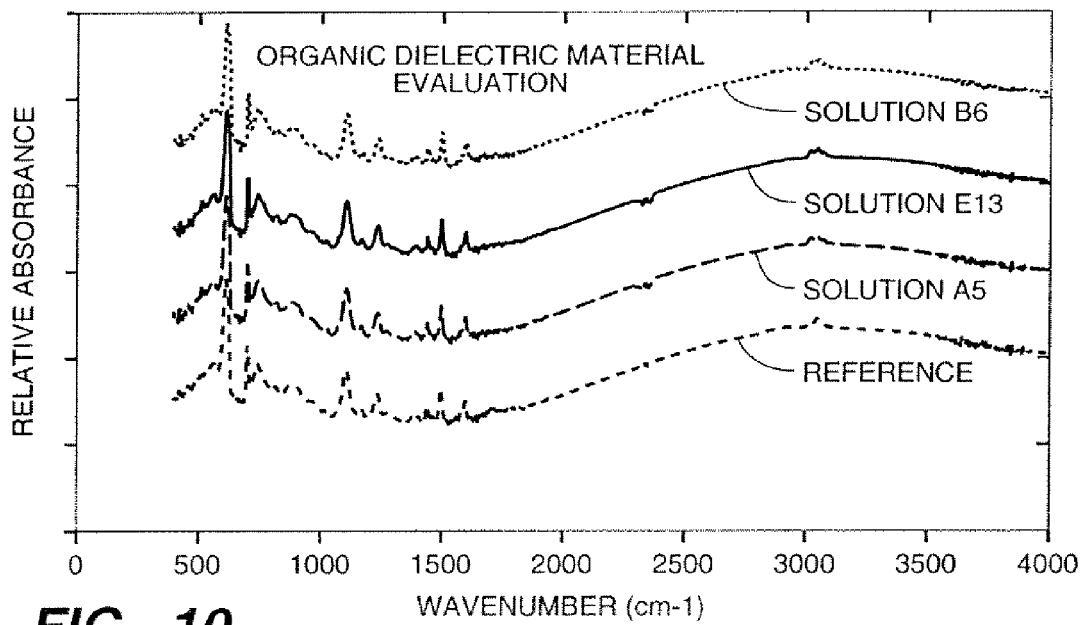
FIG._10

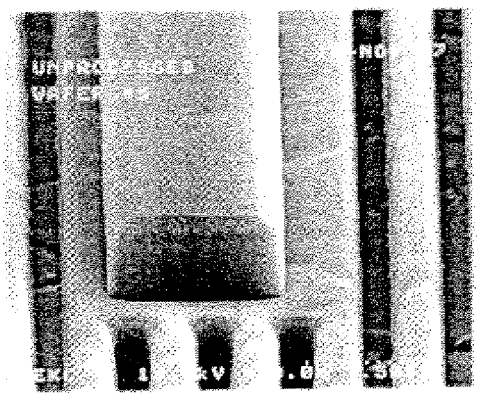
FIG._11
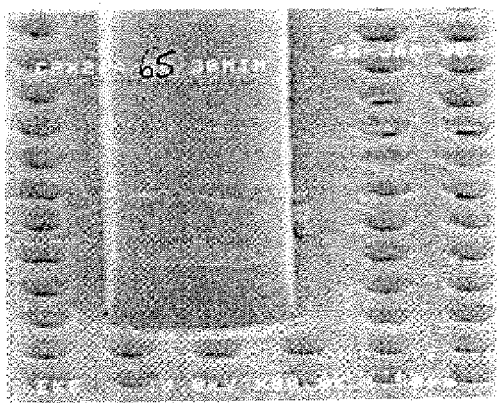
FIG._12
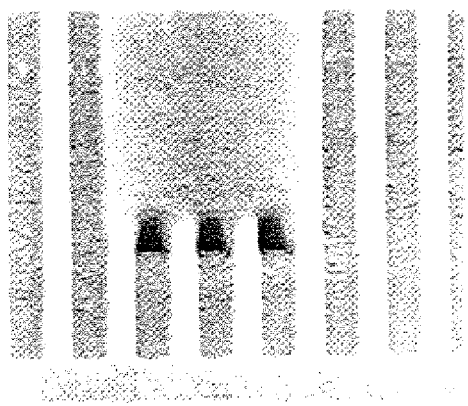
FIG._13
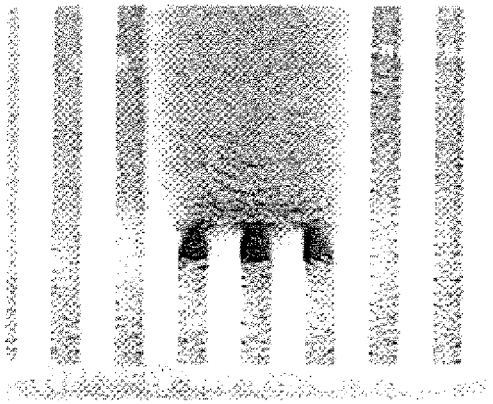
FIG._14
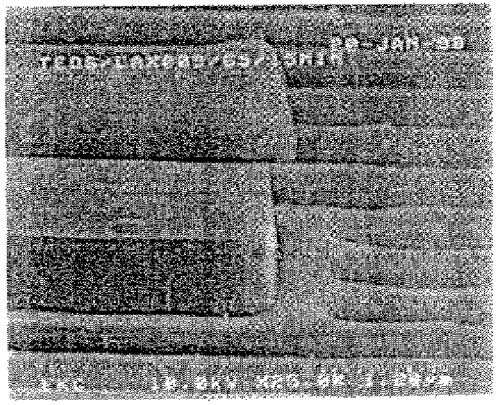
FIG._15
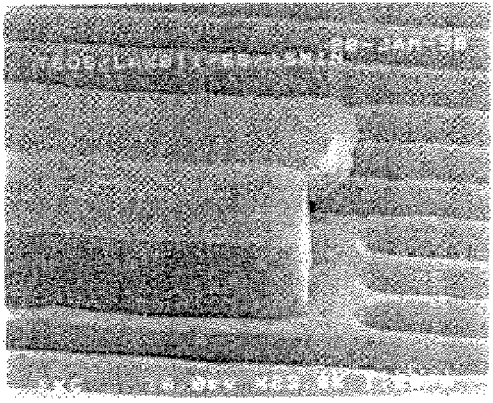
FIG._16

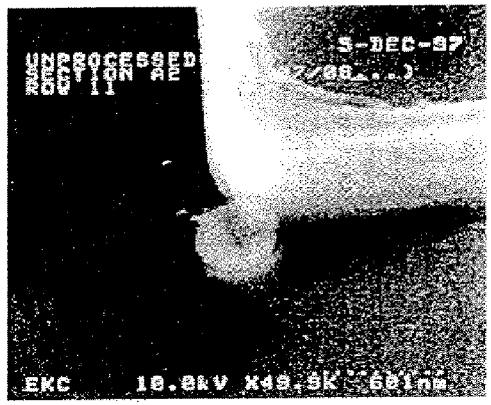
FIG._17
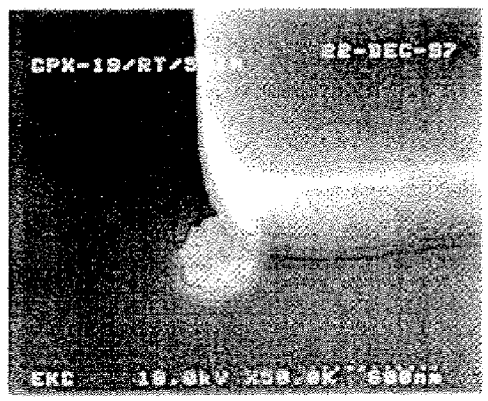
FIG._18
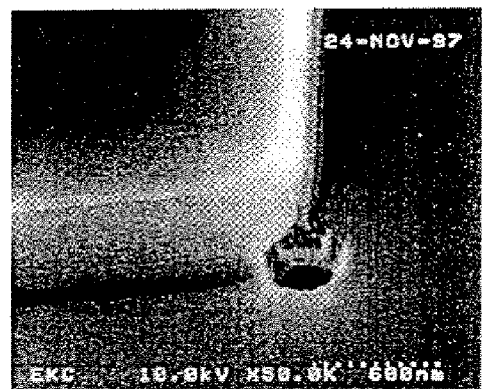
FIG._19
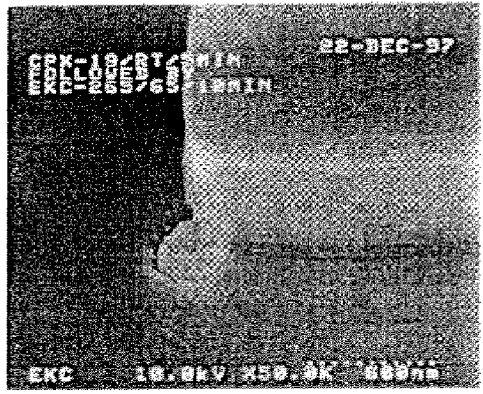
FIG._20
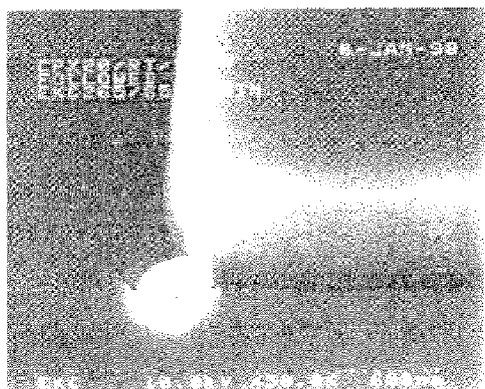
FIG._21
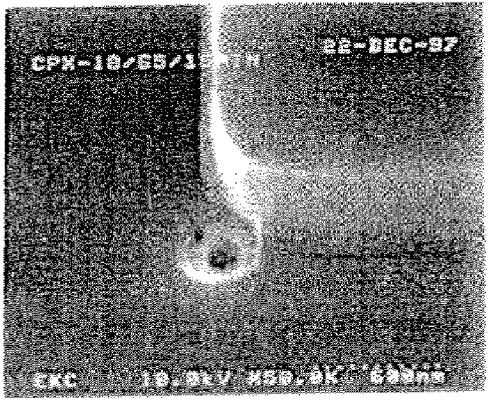
FIG._22

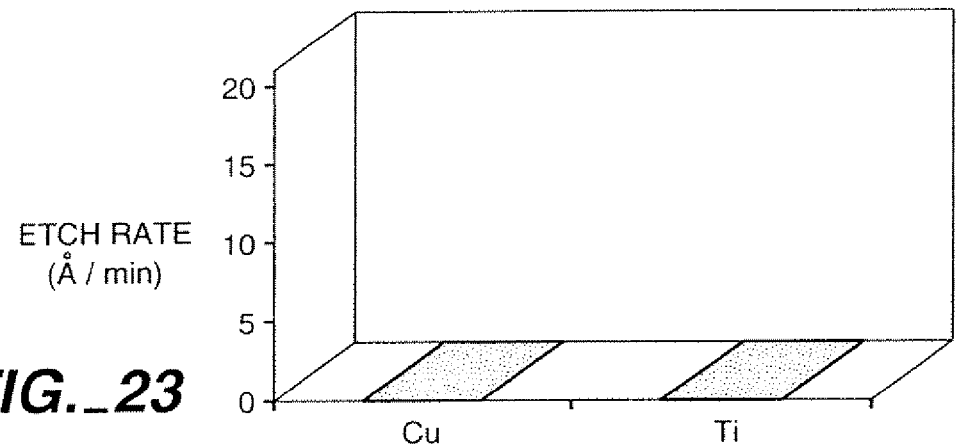
FIG._23
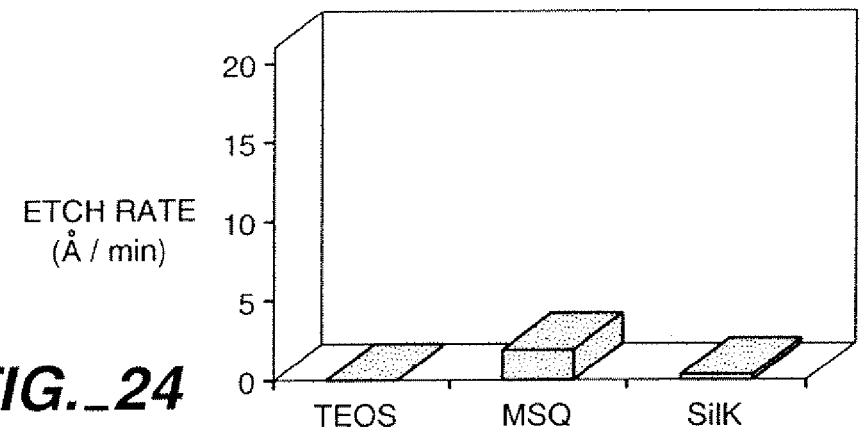
FIG._24

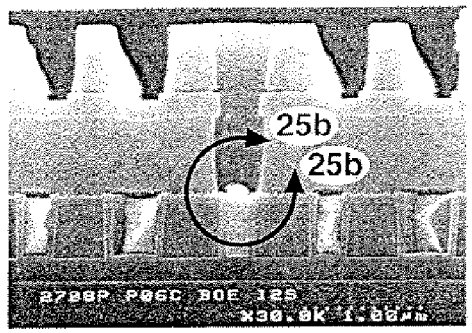
FIG._25a
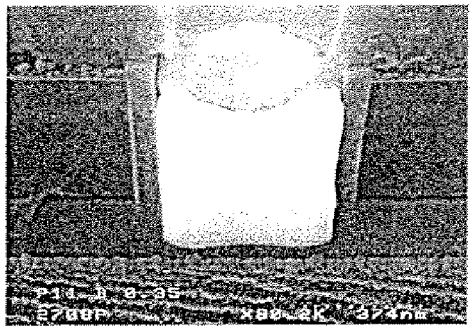
FIG._25b
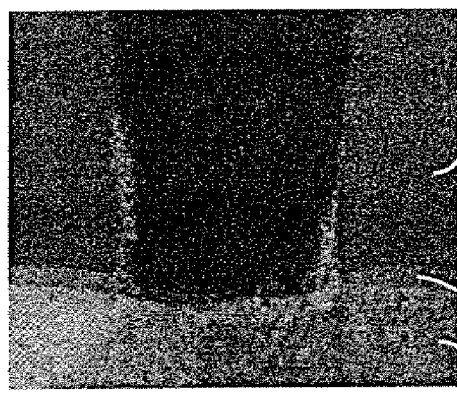
FIG._26
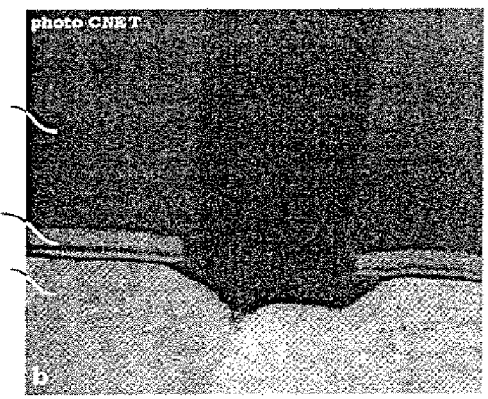
FIG._27
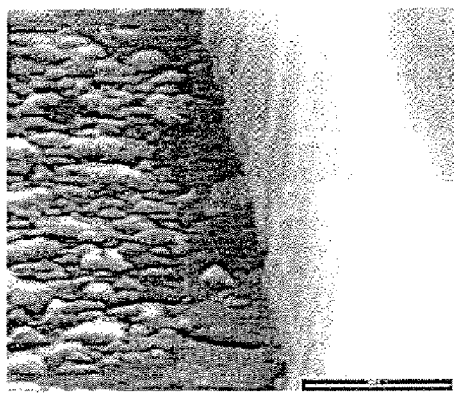
FIG._28
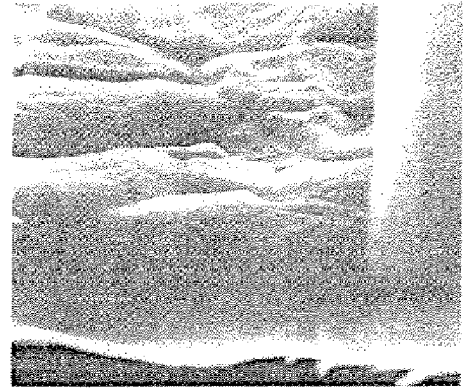
FIG._29

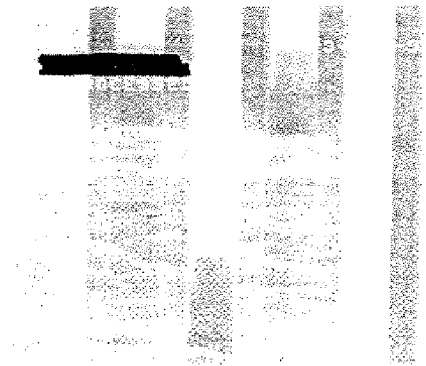
FIG._30
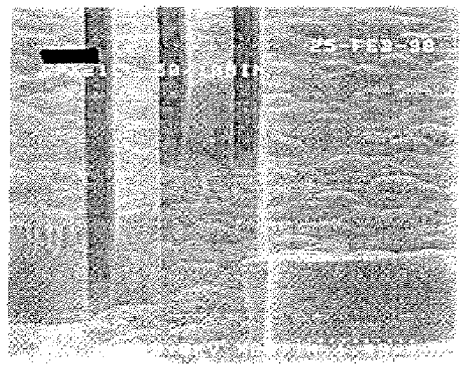
FIG._31
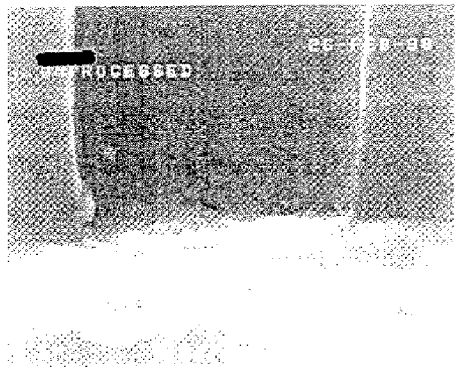
FIG._32
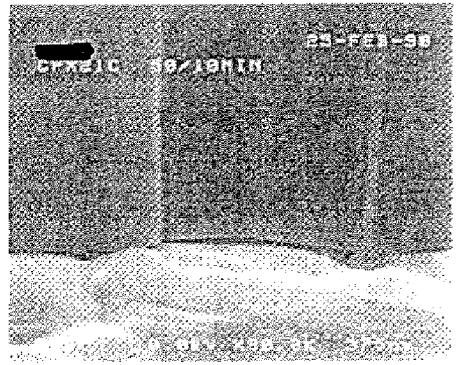
FIG._33
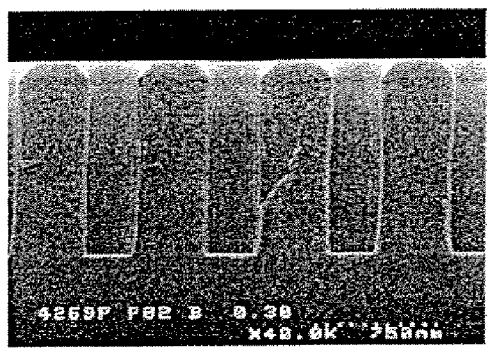
FIG._36
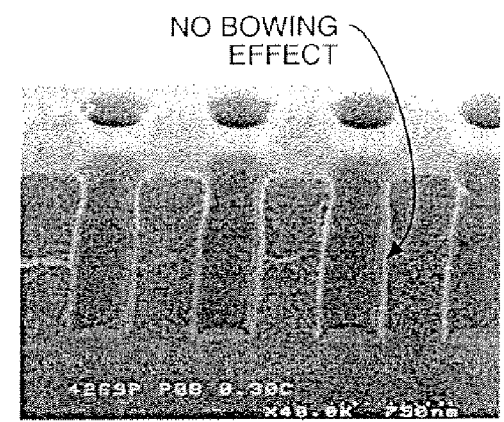
FIG._37

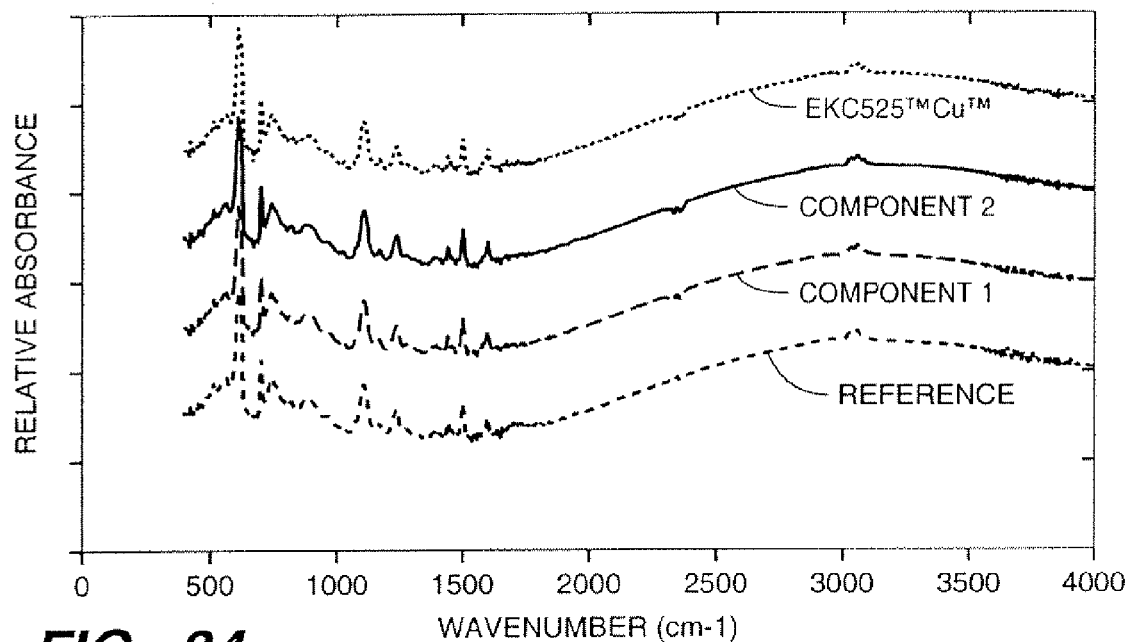
FIG._34
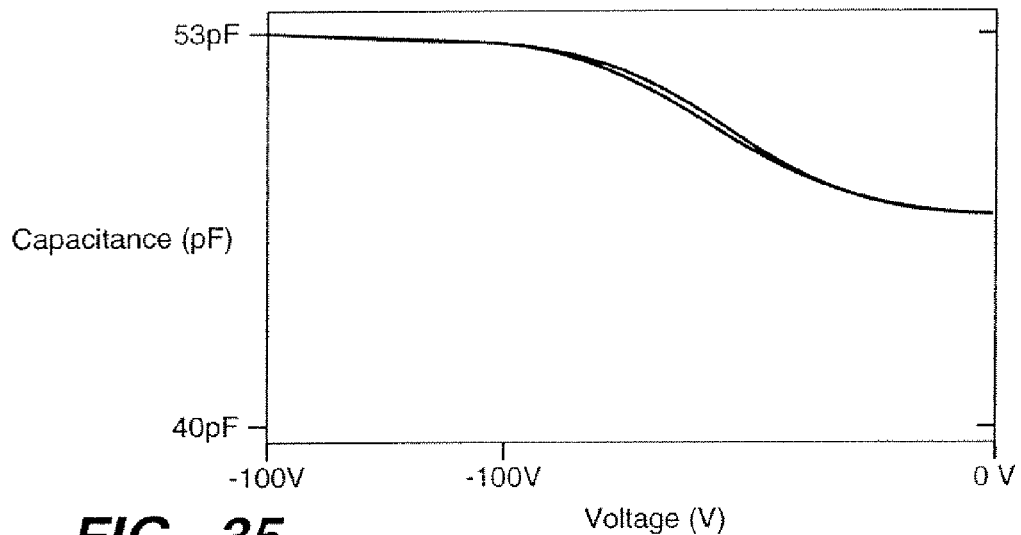
FIG._35

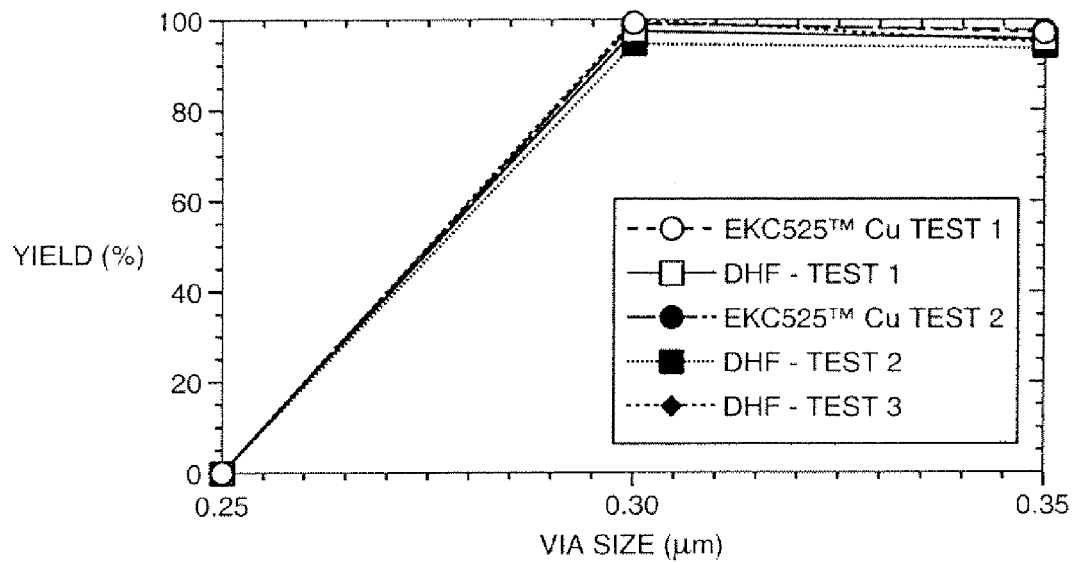
FIG._38  YIELD RESULTS ON COPPER TEOS STRUCTURE VERSUS VIA SIZE COMPARING DHF AND CLEANING SOLUTION
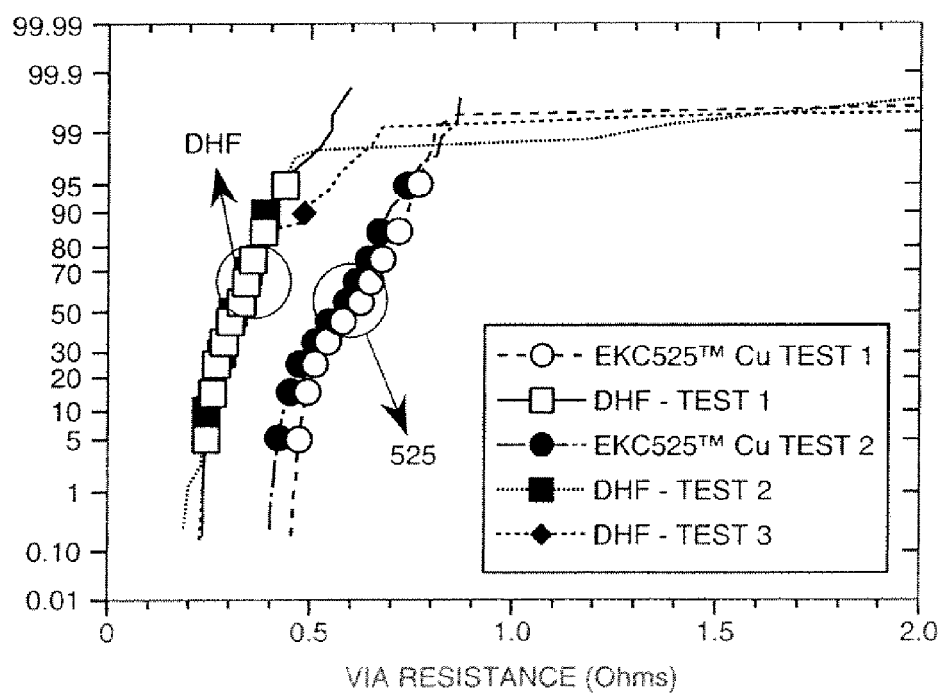
FIG._39  VIA RESISTANCE HISTOGRAM FOR 0.3 μm VIAS COMPARING DHF AND CLEANING SOLUTION

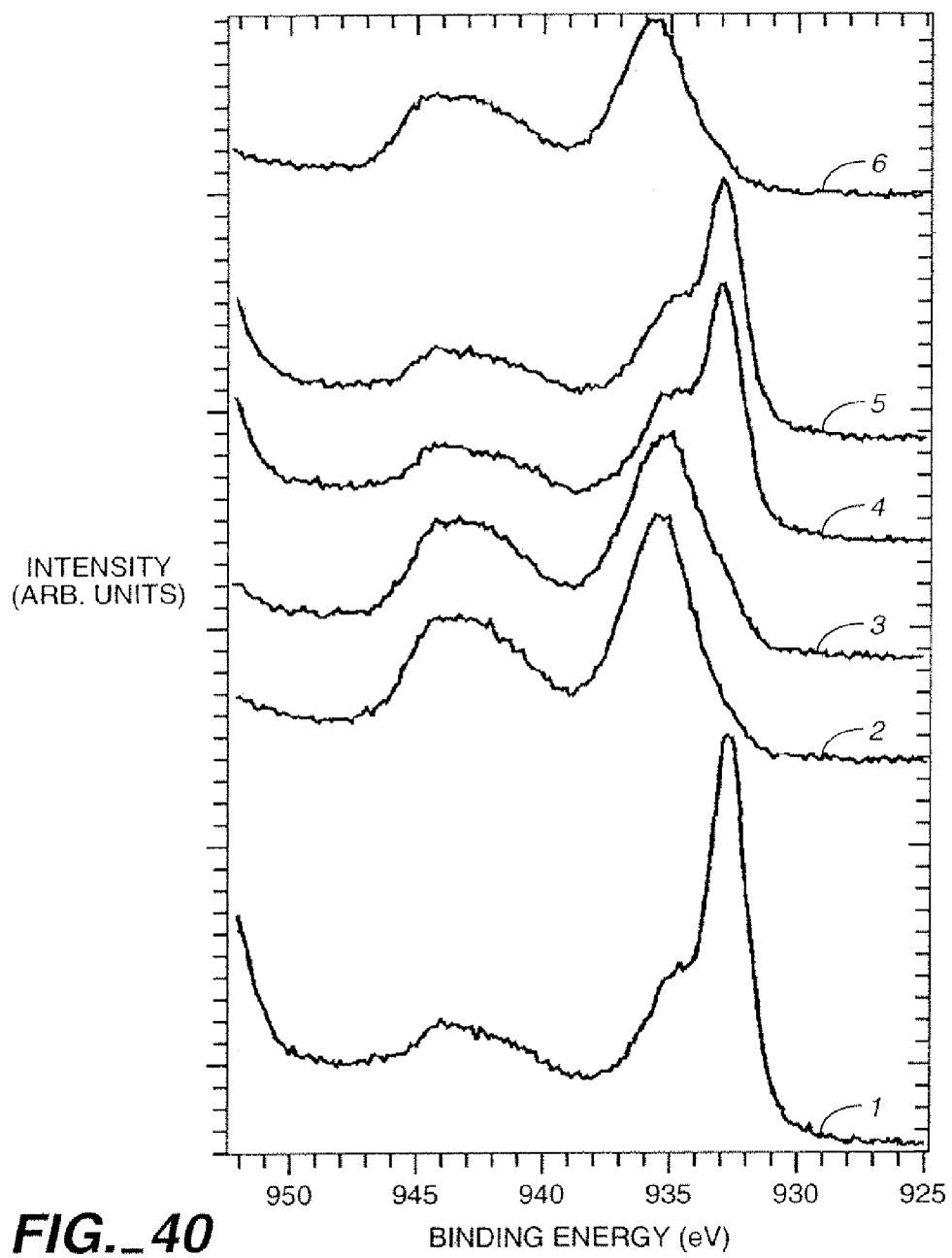
FIG._40
XPS ANALYSIS OF THE SURFACE COMPOSITION OF A COPPER BLANKET BEFORE (1), AFTER ETCHING (2 AND 3) AND AFTER CLEANING IN THE SOLUTION (4 AND 5) AND IN SOLUTION B8 (6).

REMOVER COMPOSITIONS FOR DUAL DAMASCENE SYSTEM

RELATED PATENT APPLICATIONS

This is a continuation-in-part of U.S. patent application Ser. No. 10/689,657 filed Oct. 22, 2003 now U.S. Pat. No. 7,135,445, which is a continuation-in-part of U.S. application Ser. No. 10/007,134, filed Dec. 4, 2001 now U.S. Pat. No. 7,157,415, which is a divisional application of U.S. application Ser. No. 09/343,532, filed Jun. 30, 1999, now U.S. Pat. No. 6,417,112, which claims priority to U.S. Provisional Patent Application No. 60/092,024, filed Jul. 6, 1998, additionally claims priority to U.S. Provisional Patent Application No. 60/623,190, filed Oct. 29, 2004, and is related to a commonly-assigned, co-pending patent applications, entitled "Post Etch Cleaning and Stripping Compositions for Dual Damascene System," filed on the same day as the instant application, the entire contents of which are each incorporated by reference herein.

BACKGROUND OF THE INVENTION

The present invention relates generally to manufacture of semiconductor devices incorporating a metal interconnect. More specifically, it relates to compositions and processes to remove post etch residues, photoresists and other polymers at an interconnect level, such as with a copper metallurgy, preferably incorporating a damascene/dual damascene structure. The invention also relates to a flexible remover chemistry that can be used in such damascene/dual damascene processes, as well as for other remover applications, such as aluminum, or aluminum alloy interconnects with misarranged tungsten plugs.

Today's 0.18 μm technology is reaching hole dimensions of 0.25 μm. Since the introduction of 0.25 μm technology, interconnects are becoming the limiting speed factor of the device due to interconnect resistively as well as the RCA delay induced by adjacent interconnects. This is expected to continue with feature sizes decreasing further in the manometer ranges (e.g., 65 nm devices). More recently developed interconnects use copper as the conducting material and low-k or ultra low-k dielectric material (a dielectric, having a dielectric constant smaller than the dielectric constant of silicon dioxide, e.g., porous low-k dielectrics). Copper has been selected due to its lower resistance than aluminum interconnects. Similarly, another way to achieve reduced capacitance between adjacent metal lines is to decrease the dielectric constant of the material in-between the lines. Accordingly, the industry has been introducing a variety of new low-k and ultra low-k materials. A key challenge in reduced geometry devices, such as 0.18 μm technology, is the interconnect RC delay time, which becomes the limiting factor of the device performance. This delay can be improved by combining low and ultra low k dielectrics as better insulators and the use of copper as a better conductor. The demand for faster devices and continued reduction is device size has required the use of different processing approaches to accommodate the materials.

Copper has been chosen because it is a relatively inexpensive metal with better conductivity ($\rho=1.7$ Ωcm) than aluminum ($\rho=2.7$ Ωcm). However the main drawbacks of this material are (1) its high diffusivity into silicon, introducing risk of a "device-killing" defect in the front end device, and (2) the difficulty of dry etching copper containing metallurgies and integrating such metals in traditional processes. Copper does not form an oxide passivation layer under ambient conditions (as aluminum does), making this metal very difficult to work with.

Since copper can not easily be dry etched, the use of damascene or dual damascene structures have emerged to integrate copper containing materials as, for example, interconnects in semiconductor devices. The emergence of dual damascene processes, combined with the appearance of a variety of new materials such as organic polymers for low-k and ultra low-k inter metal dielectric material, and the need to etch complex layers of dielectric materials, photoresist removal and cleaning steps require a new strategic approach.

Dual damascene structures are the easiest way to introduce copper containing metallurgies and have the advantage of incorporating both lines and vias in one deposition step; this reduces the number of process steps and is therefore cost effective. Variations of the dual damascene structure exist, incorporating a series of layers for process purposes such as anti-reflective coatings, adhesion promoters, moisture barriers, diffusion barriers, polishing stops, buried etch mask and so on. The choice of whether those have to be used or not and what material ($SiO_xN_y$ or $Si_x N_y$) should be used for them often depend upon the final choice of the low-k or ultra low-k material.

Due to the variety and complexity of the process and materials such as the choice of dielectric, stripping and cleaning is a critical step in the dual damascene process. In particular, it is important to inhibit infiltration into and contamination of the low-k and ultra low-k material due to back sputtering, which can change k values. The typical location of such is on the sidewalls of trench and via features, where low-k and ultra low-k properties are particularly important. Therefore, it is desirable to have a flexible remover that can effectively remove copper containing materials, such as residues and remaining polymer, that could lead to such infiltration and contamination on the sidewalls of the trench and via.

During the fabrication of microcircuits, photoresist material is used to pattern, and transfer patterns onto the appropriate material. For example at interconnect levels the appropriate material will be either metal for electrically conducting paths or dielectric for isolating material in-between the conducting lines.

FIGS. 1 and 2 show a typical structure used in this case. To integrate copper and eventually aluminum, the pattern is transferred from the photoresist (3) through the dielectric (2). The gaps are then filled up by the conducting layer. This process is called damascene and can integrate either one level of interconnect only (single damascene) or both the horizontal interconnects and the vertical interconnects called vias (dual damascene). Vias always open atop the underlying metal lines (1) and good cleanliness of the via is required in order to minimize electrical resistance along the interconnect.

Various processes have been developed to build those structures, as disclosed, for example, in U.S. Pat. Nos. 5,739,579; 5,635,423; 5,705,430 and 5,686,354, which can include optional layers into the dielectric stack (5, 6) but all such processes have in common:

that the via needs to be cleaned of all post etch residues (7 and 8), without damaging the metal, before the second metal layer can be deposited, that the whole dielectric material needs to be cleaned of copper compounds back-sputtered onto the sidewall and top surface (8) on the underlying copper during the final part of the etching, called "opening".

that remaining polymer, such as photoresist or other gap-fill polymer or sacrificial polymer needs to be effectively removed prior to filling the trench and via with copper.

Accordingly, IC manufacturing requires the excellent cleaning of copper residues, as copper diffuses very easily into silicon dioxide and other dielectric materials ultimately risking the creation of a failure ("killing" the device) and effective removal of polymer and photoresist. It is further advantageous if one chemistry can be used in all applications while simultaneously avoiding unacceptable etching of the copper substrate.

It has been described previously to clean materials used in the semiconductor industry by including a small amount (generally between 1% and 5% weight) of choline and other compounds to remove or avoid adsorption of metal impurities (U.S. Pat. Nos. 4,239,661, 4,339,340, PAJ 6,163,495, PAJ 6,041,773, PAJ 2,275,631, PAJ 1,191,450). Choline base is also well known for its use as developer of positive working photoresist (U.S. Pat. Nos. 4,294,911, 4,464,461). It has also been recognized that choline base can act as a etching agent of metal for thin film layer definition (PAJ 62,281,332, U.S. Pat. No. 4,172,005) and that adding choline atoms into an etching chamber when etching copper helps to lower the process temperature and hence minimize copper oxidation. U.S. Pat. No. 5,846,695 discloses aqueous solutions of quaternary ammonium hydroxides, including choline, in combination with nucleophilic amines and sugar and/or sugar alcohols, for removal of photoresist and photoresist residues in integrated circuit fabrication. However, U.S. Pat. No. 5,846,695 requires sugar and/or sugar alcohols to prevent corrosion while the present invention is sugar and/or sugar alcohol free while still providing low rates of corrosion.

In addition, the formulations of the present invention effectively remove polymers, such as photoresist, antireflective coatings and gap-fill or sacrificial polymers, in addition to cleaning residues left after etching dielectric material and openings to the copper layer. Those residues can be minimal if the main etching residues and photoresist are cleaned/stripped before the final step of forming openings on copper—if an etch stop layer is used, in which case the residues are due to the "opening" etch step only, e.g. copper rich residues on the bottom of the openings and copper back sputtered onto the dielectric material surfaces. But the residues become more complex if the "opening" etch is done directly after the main etch or if the process does not use an etch stop layer and the opening etch is done simultaneously with opening the via—in a trench first dual damascene process. In that case, the post etch treatment is required to clean main etch residues (containing CFx, CHFx . . . ), to clean the bottom residues (containing Cu, CuO, $CuO_2$), as well as the back sputtered copper and polymer remaining post etch in either or both the via or the trench.

Existing wet remover, stripping and cleaning compositions used in the semiconductor industry are not suitable in such situations for the following reasons:

traditional amine-containing chemistries are not compatible with copper and dissolve the metal at the exposed areas;

the variety of low-k and ultra low-k dielectrics used combined with continuing demands in performance and reductions of size (e.g., to nanometer ranges) requires a remover that has both broader range of application without a loss of effectiveness as a remover.

acidic chemistries, such as dilute hydrofluoric acid solutions (DHF), have caused problems in unwantedly changing the designed dimentions of the device by aggressively attacking the sidewall of the dielectric. Furthermore those solutions are ineffective for cleaning $Cu_2O$ or $CF_x$ compounds, typically found in back-sputtered residues and as contamination to dielectric materials and such chemistries do not effectively dissolve remaining polymers and photoresists, such as acrylate and methacrylate polymers transparent in lithography <250 nm, which after processing steps, leading to the need for supplemental remover steps, such as dry removal techniques, such as oxygen plasma ashing.

Oxygen plasma ashing of remaining polymers and photoresists is not ideal in dual damascene processes and introduces additional problems, for example:

an oxygen plasma step can oxidize exposed copper to the CuO and $Cu_2O$ states, which will increase the via resistance, and an oxygen plasma step can damage exposed organic dielectric material by etching the material in an uncontrolled manner, potentially compromising the integrity of the circuit.

Regarding the dielectric, the industry's choice of low-k and ultra low-k dielectric material has yet to emerge, though various candidates have been suggested. It has been shown that a general trend to achieve lower dielectric constant uses less silicon and more carbon, often introducing voids. There is then a logical evolution from the inorganic materials (such as $SiO_2$ [∈=4], SiOF [∈=3.5]) to silsesquioxane types of material (such as HSQ, MSQ [3.0<∈<3.5]), towards organic material, such as benzyl cyclobutane (BCB) or silicon low k (SiLK) [∈=2.7]), achieving lower k values with air gaps.

Further, in certain dual damascene processes, e.g., via first, a crown or fence may be created on the top of the trench after the etch process which is difficult to remove. Dry techniques such as ashing will not remove the fence or the crown, making it desirable to have a remover that can effectively remove the fence or crown residue.

With the use of low-k and ultra low-k dielectrics, which may be porous, the use of trench-first dual damascene processes become more attractive to avoid contamination in the via caused by residual photoresist that may be absorbed by the dielectric during the trench formation in a via-first dual damascene process, altering the k value of the dielectric. Where a trench-first process is used, a sacrificial polymer layer may be used to protect the dielectric side walls during the formation of the via.

The exemplary descriptions presented herein describe a means to overcome the potential problems and disadvantages faced in a dual damascene process, such as the aforementioned low-k and ultra low-k dielectric contamination. In addition, the exemplary descriptions provide a process and chemistry to overcome potential problems in trench first dual damascene processing, such as preventing the oxidation of the copper metal due to, for example, the use of an oxygen plasma. The exemplary description introduces a flexible chemistry that can be used at several steps in the dual damascene process to remove photoresists and other polymers, while at the same time removing etch residues, simplifying the dual damascene process.

SUMMARY OF THE INVENTION

One embodiment of the present invention provides a composition and process for removing photoresists and other polymers, and cleaning post etch residues and copper containing polymeric residues formed in a dual damascene process.

Another embodiment of the invention provides such a remover and cleaning composition and processes which is compatible with copper and dielectric materials, such as low-k, ultra low-k and porous low-k dielectrics used in dual damascene processes.

A further embodiment of the invention is to provide such a remover and cleaning composition and processes which is compatible with most low-k and ultra low-k dielectric materials (including porous low-k dielectrics), and does not substantially modify the FT-IR spectrum, dielectric constant, refractive index (RI) or thickness of such materials after use.

Another embodiment of the invention provides such a remover and cleaning composition and processes which will effectively clean residues on both sidewalls and tops of vias, including fences and crowns resulting from dual damascene processing and also removes polymeric material used in the etching process during the dual damascene process, particularly after the via is etched.

Another embodiment of the invention provides such a cleaning composition and cleaning method that will effectively clean post etch residues from a via bottom.

Another embodiment of the invention provides a composition and a process for removing polymers, such as photoresists, gap-fill/sacrificial polymers, and organic antireflective coatings, for example. Preferably, the polymers have a functional group, such as a carboxyl, More preferably, the polymers are transparent at a wavelength less than about 250 nm.

The polymer may, in some embodiments, be used as an antireflective coating or anti-reflectants for front-end and back-end lithography, including conformal products to cover topography and planarizing products to fill trenches and vias in Dual Damascence technology, such as a barrier anti-reflective coating (BARC) or an organic bottom anti-reflective coating, or gap-fill coating material. Commercial products are available from companies such as Rohm & Haas Electronic Material, Brewer Science, Inc., and Honeywell Electronic Materials etc. Further, in some embodiments, the polymer—sometimes a photoresist—may be modified prior to stripping/removal. Exemplary modifications can include, but are not limited to, chemical amplification, cross linking, chemical etching, deep ultraviolet (DUV) treatment, ion implantation, plasma treatment, gamma- or x-ray irradiation, electron beam treatment, laser ablation, or the like, or a combination thereof.

In accordance with one aspect of the invention, it has been discovered that the traditional way of cleaning the dual damascene structure cannot be efficiently applied on this combination of materials.

In accordance with another aspect of the invention, a new remover and cleaning chemistry is provided to address the problem of dual damascene fabrication, such as trench-first processes. This work starts with a wide screening of possible candidates compatible with copper and SiLK or other low-k or porous dielectric materials, the two main materials of interest in this aspect of the invention, resulting in the design of a new chemistry. This new cleaning chemistry is evaluated on damascene structures. This work is supported by scanning electron microscopy (SEM), transmission electron microscopy (TEM) and time-of-flight secondary ion mass spectrometry (TOF-SIMS) analyses on the features integrating copper, and by FT-IR and C(V) measurement for the integration of SiLK. In this aspect of the invention, a composition for removal of residues from integrated circuits comprises a choline compound, water and an organic solvent.

Another aspect of the invention is a process for the removal of a residue from an integrated circuit comprises contacting the integrated circuit with a composition comprising a choline compound, water and an organic solvent at a temperature and for a time sufficient to remove the residue from the integrated circuit.

In a further aspect of the invention, an etch stop inorganic layer at the bottom of the dual damascene structure is used to protect the underlying interconnect of copper. In this aspect of the invention, an integrated circuit fabrication process comprises forming a first silicon compound etch stop layer over a copper conducting line in the integrated circuit. A first interlayer dielectric is formed over the etch stop layer. A second etch stop inorganic layer (e.g., silicon nitride) may optionally be formed over the first interlayer dielectric. A second interlayer dielectric made of low-k or ultra low-k dielectric is formed on the optional second etch stop layer. The second layer is coated with photoresist, lithographically patterned, and an anisotropic dry etch cuts through the surface for a time sufficient to form a trench in the second interlayer dielectric or optionally to the second etch stop layer. Subsequently, the etch stop layer is removed to expose at least a portion of the first interlayer dielectric. A polymeric material is applied to the etched trough and over unetched second interlayer dielectric. The via is subsequently etched to the etch stop layer. Polymer used in the via etch step and its resulting residues are removed from the integrated circuit. The etch stop layer is etched away to expose the copper conducting line. Residues are removed from the integrated circuit with a residue removal composition containing an effective amount of a choline compound.

In accordance with another aspect of the invention, a first etch stop inorganic layer (e.g., silicon nitride) at the bottom of the dual damascene structure protecting the underlying interconnect of copper is not used in the dual damascene process above and the via is etched to expose the copper containing material. A polymeric material is applied to the etched trough and over unetched second interlayer dielectric. The via etch may then be etched through the polymeric material through lithographically patterned photoresist or through a hard mask. The via may be time etched to the copper containing substrate The remaining polymers and resulting residues, including copper residues in the via, are removed by the formulations herein.

Another aspect of the present invention is a process for treating a substrate having a dual damascene structure comprising steps of: etching a first low-k dielectric layer to form a trench and subsequently etching a second low-k dielectric layer residing over a copper containing substrate to form a via, and at one or more times, bringing the etched dual damascene structure in contact with a composition comprising:

an organic ammonium compound having the formula wherein:

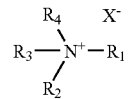

X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof, R$_1$ is an alkyl group or a group derived from the reaction of a tertiary amine with an organic epoxy, and R$_2$, R$_3$, and R$_4$ are each not hydrogen and are independently alkyl, benzyl, hydroxyalkyl, phenyl, a group derived from the reaction of a tertiary amine with an organic epoxy, or another group contained in a tertiary amine;

more than about 2% by weight of an oxoammonium compound having one or more of the formula

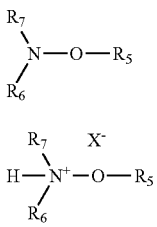

wherein:
X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof,
each $R_5$ is independently hydrogen, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof, and
each $R_6$ and $R_7$ is independently hydrogen, a hydroxyl group, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof; an organic polar solvent miscible with water and water,
wherein the composition is capable of removing the polymer, photoresist, modified photoresist, residues, or the combination thereof from the substrate, while maintaining the operability of the circuit, or portion thereof, associated with the substrate.

In one preferred embodiment the organic ammonium compound is present in an amount from about 1% to about 30% by weight, more preferably about 2%-15%, the water is present in an amount from about 15% to about 94% by weight, the organic polar solvent is present in an amount from about 25% to about 85% by weight, and the oxoammonium compound is present in an amount not more than about 10% by weight.

The above-described composition is particularly effective where the polymer or photoresist has acrylate repeat units, methacrylate repeat units, or both. Without restricting to any particular theory, it is understood that such compositions interact with the carboxyl group of the polymer or photoresist to aid in removing the polymer effectively. This interaction is also effective with polymers and photoresists with a carbonyl moiety, a nitrile moiety, a imide moiety, or a combination thereof. Examples of such polymers are the methacrylate and acrylate polymers used in organic antireflective coatings and photoresists, such as photoresists exhibiting transparency <250 nm (e.g., 193 nm photoresists). The compositions are equally effective where the polymer is modified, for example by chemical amplification, chemical etching, deep ultraviolet treatment, ion implantation, plasma treatment, gamma- or x-ray irradiation, electron beam treatment, laser ablation and the like.

Such compositions preferably are used at a pH>7, more preferably at a pH>12. In some embodiments, one or more organic polar solvents that are miscible with water can be used. Examples of such solvents include N-methyl-pyrrolidone, dimethylsulfoxide, diglycolamine, monoethanolamine, propylene glycol, or a mixture thereof.

In accordance with another aspect of the invention, the chemistries of the present invention are applied in a trench first dual damascene process to remove polymers—including photoresists and organic antireflective coatings, etch residues, and ash residues. In one embodiment, chemistries of the present invention are used to remove acrylate or methacrylate based polymers and/or the residues thereof in a trench first dual damascene process.

BRIEF DESCRIPTION OF THE DRAWINGS

FIG. 1 is a cross section view of an example of a prior art dual damascene structure.

FIG. 2 is a cross section view of a modified dual damascene structure in accordance with the invention.

FIG. 3a and FIG. 3b are a set of scanning electron microscope (SEM) and TEM photographs showing results obtained with the invention.

FIG. 4 is a TOF-SIMS analysis showing a reduction of copper contamination in use of the invention.

FIGS. 5 and 6 are SEM photographs further showing results obtained with the invention.

FIGS. 7-10 are FT-IR spectra showing results obtained with the invention.

FIGS. 11-22 are SEM photographs further showing results obtained with the invention.

FIGS. 23-24 are graphs of results obtained with the invention.

FIGS. 25a-33 are SEM and TEM photographs further showing results obtained with the invention.

FIGS. 34-35 are graphs of results obtained with the invention.

FIGS. 36-37 are SEM photographs further showing results obtained with the invention.

FIGS. 38-39 are graphs of results obtained with the invention.

FIG. 40 shows results of x-ray photo spectroscopy (XPS) analyses obtained through use of the invention.

DETAILED DESCRIPTION OF THE INVENTION

In the composition and process of this invention, the choline compound can be in the hydroxide or salt form, such as choline hydroxide, choline bicarbonate or choline chloride. As used herein, the term "choline compound" also embraces related quaternary ammonium compounds, such as tetramethylammonium hydroxide (TMAH), tetrabutyl ammonium hydroxide (TBAH), their salts, and the like.

Suitable organic solvents in the composition and for practice of the process include such polar solvents as dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, ethylene diamine and ethylene triamine. Additional polar solvents as known in the art can also be used in the composition of the present invention.

Optionally, a corrosion inhibitor may be included in a formulation used to clean damascene structures with exposed copper present. The corrosion inhibitors are present to protect copper from being corroded, and may be chosen from a variety of classes of chemical compounds, including any compounds used for the prevention of copper corrosion in other systems comprising the art.

More specifically, compounds of the general class

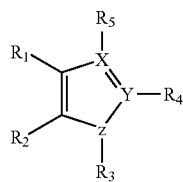

may be employed, where X, Y, and Z are chosen from C, N, O, S, and P. Under these conditions the valence requirements and presence of pendant R groups may be set appropriately. Pendant R groups R1-R5 may be chosen independently as H, optionally a substituted C1-C6 straight, branched or cyclo alkyl, alkenyl or alkynyl group, straight or branched alkoxy group, optionally a substituted acyl group, straight or branched alkoxy group, amidyl group, hydroxyl group, a halogen, carboxyl group, alkoxyalkyl group, alkylamino group, alkylsulfonyl group or sulfonic acid group; or the salt of such compounds. In a preferred embodiment X, Y and Z are nitrogen, nitrogen and carbon, respectively, and R1-R5 are hydrogen. In another preferred embodiment, X, Y and Z are nitrogen, R3

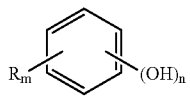

is hydrogen and R4 and R5 constitute a benzene ring.

Another class of copper corrosion inhibitors, the hydroxybenzenes, may be employed in the invention independently or in conjunction with the classes already cited herein. These comprise the general class"

Wherein n=1-4, R6 may be present from 2-5 times and may be chosen independently as H, optionally a substituted C1-C6 straight, branched or cyclo alkyl, alkenyl or alkynyl group, straight or branched alkoxy group, optionally a substituted acyl group, straight or branched alkoxy group, amidyl group, a halogen, carboxyl group, alkoxyalkyl group, alkylamino group, alkylsulfonyl group or sulfonic acid group; or the salt of such compounds. Suitable specific examples of corrosion inhibitors include catechol, t-butyl catechol and benzotriazole.

The composition optionally contains hydroxylamine or a hydroxylamine salt. If present, the composition desirably contains from about 2 to about 12% by weight of the hydroxylamine or hydroxylamine salt.

In practice, the composition contains from about 10 percent by weight to about 50 percent by weight of the choline compound, from about 10 percent by weight to about 80 percent by weight of the water, and from about 20 percent by weight to about 80 percent by weight of the organic solvent. If present, the corrosion inhibitor is typically provided in an amount of from about 0.5 to about 5 percent by weight.

Because of its inability to create a passivation layer, traditional cleaning solvents are not well suited to work with copper as they usually contain aggressive complexing agents. A screening has been undertaken to evaluate new candidates to gently remove copper etch residues without damaging the existing interconnects. Etch rates on blanket copper were measured by sheet resistance measurement using a four point probe.

Some solvents, including hydroxylamine chemistries, show a severe incompatibility with copper. The incompatibility of Cu with hydroxylamine-containing chemistries is most likely a result of two factors: the known strength of hydroxylamine as a reducing agent, and its propensity (along with amine solvents and other chelating agents) to effectively complex and solubilize metal ions. Copper-containing etch residues in a high oxidation state ($Cu^{II}$) may be reduced and solubilized to $Cu^{I}$, then reoxidized by water or dissolved oxygen back to $Cu^{II}$ in an equilibrium process:

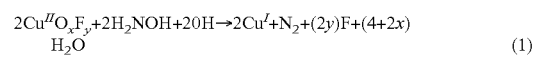

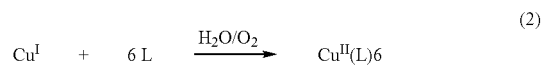

where L is an available ligand. Reaction 1 serves to assist in breaking up what is probably an amorphous, highly oxidized Cu residue of ill-defined stoichiometry, while (2) complexes the Cu, most likely oxidizing it back to $Cu^{II}$ (especially in the presence of water) in the process. At the same time, dissolved water and/or oxygen can oxidize native copper ($Cu^0$) to an oxidized form that can be dissolved by the strong complexing agents (including hydroxylamine) comprising an hydroxylamine-containing chemistry. What is important is to design a chemistry that is capable of dissolving oxidized Cu residues while shutting down the thermodynamic drive that thaws native Cu into solution; this is accomplished through judicious change of the ionic medium employed.

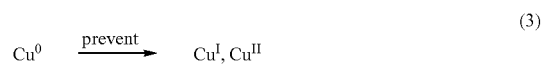

1. Cleaning of Damascene Type Structures Integrating Copper:

A purpose of this invention is to remove residues and/or polymeric materials from damascene type structures after processing when copper is exposed. In the first example presented here (FIG. 3), the sample is a blanket copper with a single layer of TEOS (silicon dioxide type of dielectric) etched. The etch has been realized in two steps: first the main etch through the bulk dielectric, followed by a cleaning step where photoresist and main post etch residues are removed into conventional solvent while copper is still protected by a thin nitride layer; then a second short etch is realized to open the structure to copper, leaving a minimum of residues on the bottom and sidewall of the structure.

A solution of choline hydroxide (solution B6) was used to successfully clean those residues at 50° C. for 10 mm (FIG. 3).

XPS (X-Ray Photo Spectroscopy) analysis of such a structure shows the effect of the invention at removing CuO and $CuO_2$ compounds (FIG. 4).

Table I summarizes various compositions used to clean such a structure, and their result on the cleaning efficiency and copper attack at the bottom of the structure. Results are rated from 0 to 10 by subjectively analyzing SEM pictures. A 0 rating means bad and 10 is good. However we note that if cleaning is bad, corrosion inhibition is usually good only because the residues protect the copper material. This is for example the case of pure water (A1).

From solutions A1, A2, A3, A4, and A5 we observe that cleaning efficiency increases when choline concentration reaches 20%. However we note that such concentration creates a thin foam at the surface of the solution and that adding a solvent such as, for example, propylene glycol, reduce this foaming effect without reducing the cleaning efficiency (solutions B1, B2, B3, B4, B5 and B6). This foaming effect however is reduced depending upon the type of stabilizer used with the raw material of choline hydroxide, and if the raw material is chosen correctly, the solution might not require an additional solvent.

We have investigated the process conditions for those cleaning solutions and found better results at temperatures below 50° C. The time does not appear to be important and we would recommend a process time between 10 and 30 minutes depending upon the difficulty of removing the residues.

Alternatively the use of other quaternary ammonium systems such as TMAH (Tetramethyl ammonium hydroxide), or TBAH (Tetrabutyl ammonium hydroxide) can have satisfactory results on the cleaning of such structures.

TABLE 1

Result on Post Etch Residues cleaning and copper attack for various solutions (scored 0: bad to 10: good)

| Solution | Op. Temp. | Op. Time | Cleaning efficiency | Copper corrosion |
|---|---|---|---|---|
| A1 | 80 | 15 | 0 | 10 |
| E7 | 80 | 30 | 0 | 5 |
| E36 | 70 | 10 | 7 | 10 |
| D21 | 45 | 10 | 10? | 10? |
| D11 | 50 | 10 | 7 | 10 |
| D12 | 50 | 10 | 9 | 10 |
| D8 | 70 | 10 | 9 | 5 |
| D10 | 45 | 10 | 5 | 5 |
| D8 | 50 | 10 | 5? | 5 |
| D22 | 45 | 15 | 7 | 10 |
| D23 | 45 | 15 | 2-5 | 10 |
| D24 | 45 | 15 | 0-2 | 10 |
| D25 | 45 | 15 | 0 | 10 |
| D13 | 45 | 15 | 7 | 10 |
| DI4 | 45 | 15 | 0-2 | 5 |
| D15 | 45 | 15 | 0 | 10 |
| D16 | 45 | 15 | 9 | 9 |
| D17 | 45 | 15 | 7 | 10 |
| D18 | 45 | 15 | 2-5 | 10 |
| B6 | 50 | 10 | 10 | 9 |
| A2 | 50 | 10 | 7 | 2 |
| A3 | 50 | 10 | 5 | 2 |
| A4 | 50 | 10 | 10 | 9 |
| A5 | 50 | 10 | 9 | 10 |
| B1 | 25 | 5 | 7 | 9 |
| B1 | 75 | 5 | 9 | 9 |
| BI | 75 | 25 | 7 | 10 |
| B2 | 25 | 5 | 5 | 10 |
| B2 | 75 | 5 | 5 | 10 |
| B2 | 75 | 25 | 5-7 | 7 |
| B3 | 25 | 5 | 0 | 10 |
| B3 | 75 | 5 | 5 | 10 |
| B3 | 75 | 25 | 5 | 10 |
| B4 | 25 | 5 | 2-5 | 10 |
| B4 | 75 | 25 | 2-5 | 10 |
| B5 | 25 | 5 | 0 | 10 |
| B5 | 75 | 5 | 7-9 | 10 |
| B5 | 75 | 25 | 7-9 | 10 |
| B5 | 50 | 10 | 10 | 9 |
| B6 | 25 | 5 | 9 | 10 |
| B6 | 75 | 5 | 7 | 10 |
| B6 | 75 | 25 | 7 | 10 |
| C6 | 50 | 10 | 7 | 5 |
| C1 | 50 | 10 | 7 | 9 |
| C2 | 50 | 10 | 7 | 7 |
| C3 | 50 | 10 | 7 | 5 |
| C4 | 50 | 10 | 7-9 | 9 |
| C8 | 50 | 10 | 7 | 5 |
| C9 | 50 | 10 | 7 | 7 |
| C10 | 50 | 10 | 5 | 10 |

In our second example the structure has been etched in one step directly opening on copper. FIG. 5 shows the example of residue found at the bottom of the structure. FIG. 6 shows that the invention was not able to clean such a residue under the conditions employed.

Dual damascene structures have the advantage of reducing process steps for interconnect manufacture. Hence, process engineers research the simplest structure possible in order to preserve this cost advantage. Also, the introduction of too many layers participates in the increase of the global dielectric constant of inter-metal dielectric materials. This increase can be as high as 20%, in which case the benefits earned by using a new dielectric material are lost.

The simplest structure, the first approach tested, consisted of etching both lines and via levels down to the underlying copper. In this example a buried hard mask is included and used to pattern the via level, while photoresist was used to pattern the line level. A typical example is shown in FIG. 25, where the opening on copper forms some "mushroom"-type residues.

The high aspect ratio of such a structure, the wafer non uniformity of the etch, and etch lag all demand a minimum overetch of the structure into the copper, resulting in two main issues that need to be addressed: firstly, copper is back sputtered all over the structure (sidewalls and top), likely to diffuse later into the dielectric material and eventually reach the front end device; and secondly, post etch residues created in this case are more difficult to remove. They are very strongly anchored to the wall, and have a complex composition (Cu, CuO, $Cu_2O$, silicon from the dielectric, carbon from the photoresist, fluoride species from the etching gases, etc.).

Various traditional cleaning treatments were tested on these residues, and failed to give satisfactory results. Therefore, from a process integration standpoint, the use of a one-step etch opening directly on copper is not ideal.

One of the strategies chosen in this work was the introduction of a thin $Si_xN_y$ layer at the bottom of the structure, which is used as an etch stop for the main etch step. This permits photoresist removal while isolating the etch residues generated from the dielectric etch from those generated from opening on copper.

At the same time, photoresist removal can proceed in the absence of exposed copper. Here again, the weakness of the natural copper oxide layer makes the photoresist removal step an issue. Indeed, traditional methods of photoresist stripping (such as plasma $O_2$) will in most cases oxidize and attack the metal.

Lithography was performed on the DUV 248 nm ASML/90 stepper and damascene structures are etched on the TEL Unity 85 DRM. The photoresist was removed by a combination of downstream oxygen and forming gas plasma (IPC Branson 3500L) followed by a copper compatible product, to compensate for the possibility of premature punch-through of the $Si_xN_y$ layer. Posistrip®EKC®LE is used in WSST 640 from SEMITOOL at 60° C. for 15 minutes.

The remaining residues are now easier to remove. However, an issue still remains with back sputtered copper on the sidewall of the structure, because in the second etch step copper is exposed. At this stage the generated residue contains a large quantity of copper, which can be removed as discussed above. As shown in the TEM picture in FIG. 26, the final etch back-sputters a large amount of copper residue on the sidewalls and top of the structure. This contamination has to be removed before the next metallization step; otherwise, it will be trapped under the diffusion barrier.

Various papers report the use of dilute HF solutions to clean these types of residues. The ability of these solutions to clean is well known for front end processing, but shows some disadvantages at the interconnect level, in that cleaning proceeds through attack of the dielectric and results in a loss in critical dimensions. It has also been reported that these solutions are not effective in removing $Cu_2O$ types of residues.

The samples used in this study are composed of a blanket layer of CVD copper, with a single damascene of TEOS. Solution B6 is used at 50° C. for 10 min in a SEMITOOL to remove these residues.

The TEM cross section (FIG. 27) shows the cleaning efficiency of solution B6 at the bottom of the via and on the sidewalls. A slight attack of the metal at the bottom of the via is due to the ability of the chemistry to remove damaged or oxidized copper. During opening of the via on copper, there is not only some copper backsputtered onto the sidewall but also the structure of the exposed copper is mechanically changed (hammer-hardened) by the etching. It is necessary to remove this transformed material, which would increase the via resistance. The resulting shape of the material is not a problem as the lateral attack is lower than 50 nm and the via will next be filled by fresh copper.

A TOF-SIMS analysis on the top of the surface shows the quantitative reduction of copper contamination from $9 \times 10^{14}$ atoms/cm2 before cleaning to $9 \times 10^{13}$ atoms/cm2 after use of solution B6. The detection limit of the equipment is about $10^{12}$ atoms/cm2.

Furthermore, a blanket silicon wafer is introduced in the SEMITOOL during processing as a control for copper contamination. The contamination of the native oxide of this wafer is analyzed by vapor phase decomposition total reflection x-ray fluorescence (VPD-TXRF), and shows that not only does the chemistry remove copper contamination but also does not redeposit this contamination elsewhere.

FIGS. 28-33 demonstrate the cleaning efficiency of solution B6 on large areas of exposed copper (FIGS. 28-29), trenches (30-31), and holes (32-33). We note that an artifact due to sample cross sectioning breaks some TEOS lines which allows a comparison between the copper exposed to the etch process and that which was protected by the dielectric. This shows that solution B6 effectively cleans the residues, with no global attack of the copper (as demonstrated in FIG. 23), but the gentle action of the product is shown by the clear definition of the grain boundaries.

FIGS. 38 and 39 show electrical results on an integrated circuit with 2 levels of copper. Via resistance is a measure of the cleaning efficiency at the contact between the 2 layers. The via resistance after cleaning with solution B6 corresponds to the theoretical via resistance, which proves a good cleaning with the via dimension being respected.

FIG. 40 shows the efficiency of solution B6 to reduce post etch residues. Curve (1) shows the composition of the blanket copper in ambient air, with a high peak intensity at 932.5 eV. for $Cu_2O$. Curves (2) and (3) show the composition of the blanket copper after an $O_2/N_2$ plasma etch for 34 sec. and 68 sec. respectively. The residues consist of CuO detected at 935 eV. Curves (4) and (5) show the composition of the blanket copper surface after processing through plasma etch, followed by cleaning in solution B6 for 2 min. and 20 min., respectively. This shows a reduction of the CuO residues to a less oxidized state.

2. Etch Rates:

Because a purpose of this invention is to remove residues and/or polymeric materials from damascene type structures when copper is exposed, a series of solvents were tested for compatibility with copper. Etch rates on metals are measured by using a four point probe on blanket sample, measuring the evolution in sheet resistance of the material versus time processed into the solution. The resultant etch rates are converted into Angstrom per minute (Å/min), as in table 2.

It is shown that choline solutions (for example solutions A5, D19, or D3) are compatible with copper material and will not attack the copper material when it is exposed to the solution during cleaning.

The concentration of choline hydroxide has been varied from 10% to 50% with added solvent, e.g., propylene glycol varying from 0% (solution A5) to 50% (solutions B6, C2, C4) and show good compatibility with copper (table 2).

The invention shows good compatibility with most low-k dielectric materials used in integrated circuit fabrication. Compatibility with dielectric materials is evaluated by the two following methods:

thickness measurement by ellipsometry (table 3);
material characteristic by FT-IR (Fourier transform infra red) (FIGS. 7 to 10)

As above in the case of metal, thickness evolution is evaluated versus time of processing in the solution, and results are given in Å/min. (Table 4). FT-IR spectra of the processed material are compared to the initial spectrum in order to detect any structural or chemical change in the material.

Materials tested were silicon dioxide (TEOS), hydrogen silsesquioxane (HSQ), methyl silsesquioxane (MSQ) and organic dielectric, in solutions of choline hydroxide 50% (A5), propylene glycol 100% (E13), and mixtures of both (solution B6) (FIGS. 7-10).

We observe good compatibility between these solutions and TEOS, MSQ, and organic dielectric. The FT-IR of HSQ however shows a slight absorption of moisture (around 3500 $cm^{-1}$) which correlate to our observation of spots in the material. We anticipate a lift-off of this material if a patterned sample is processed in these solutions.

A C(V) curve measures the capacitance of a structure composed of metal/dielectric/silicon versus voltage. It gives an indication of the dielectric under stress conditions. FIG. 35 shows that processing with solution B6 does not change the properties of an organic dielectric material and that no hysteresis is induced.

These results show that the invention is compatible with most materials used to integrate copper in modern interconnects.

TABLE 2

Etch rate on copper of various solvents

|  | test temp. | Test 1 dT/dt (Å/min) | Test 2 dT/dt (Å/min) | Test 3 dT/dt (Å/min) |
|---|---|---|---|---|
| A5 | 80 | 2.79 |  | 0.8 |
| D19 | 80 | 2.86 |  |  |
| D3 | 80 | 9.81 |  |  |
| E1 | 80 | −3.36 |  | 0 |
| E2 | 80 | 4.75 |  | 6.7 |

TABLE 2-continued

Etch rate on copper of various solvents

|  | test temp. | Test 1 dT/dt (Å/min) | Test 2 dT/dt (Å/min) | Test 3 dT/dt (Å/min) |
|---|---|---|---|---|
| E3 | 80 | −3.24 | | |
| E4 | 80 | 7.71 | | 17 |
| E5 | 80 | 44.95 | | 9 |
| E6 | 80 | 4.11 | | |
| E7 | 80 | 39.65 | 74.47 | 54 |
| E8 | 80 | 1.34 | −5.23 | 1.1 |
| E9 | 80 | −2.32 | | |
| E10 | 80 | −1.21 | | |
| E11 | 80 | −2.50 | −2.82 | |
| E12 | 80 | −15.77 | | |
| E13 | 80 | −0.83 | | −1.4 |
| E14 | 80 | 23.01 | −1.68 | |
| E15 | 80 | −0.97 | | |
| E16 | 80 | 0.84 | | |
| E17 | 80 | 28.65 | | |
| E20 | 80 | 6.30 | | |
| E21 | 80 | −58.32 | | |
| E22 | 80 | 0.15 | | |
| E23 | 80 | 0.82 | | |
| E24 | 80 | −2.36 | | |
| E27 | 80 | 6.03 | | |
| E28 | 80 | −0.80 | | |
| E29 | 80 | 25.90 | | |
| E30 | 80 | 4.17 | | |
| E31 | 80 | −40.15 | | |
| E34 | 80 | 8.69 | | |
| E35 | 80 | 7.45 | | |
| A5 | 45 | 0.8 | | |
| B5 | 45 | 0 | | |
| B6 | 45 | 0.3 | | |
| C1 | 45 | 0 | | |
| C2 | 45 | 13 | | |
| C3 | 45 | 8 | | |
| C6 | 45 | 0.7 | | |
| C8 | 45 | 6 | | |
| C9 | 45 | 0 | | |
| C10 | 45 | 6 | | |

TABLE 3

Etch rates on dielectric materials and metals for selected solutions.

| # | Dielectric Materials | | | | Metals | |
|---|---|---|---|---|---|---|
|   | TEOS | HSQ | MSQ | SiLK | Cu | Ti |
| E8 | 0.0 | 4.0 | −0.3 | −23.7 | 1.1 | |
| EI | 0.0 | 5.3 | −1.9 | −15.4 | 0.0 | |
| E2 | 0.0 | 4.8 | −1.0 | 0.2 | 6.7 | |
| E4 | 0.9 | 6.4 | 10.5 | −0.9 | 17.0 | |
| E7 | 0.0 | 0.0 | 0.6 | 0.0 | 53.5 | |
| E5 | 2.4 | 9.2 | −2.3 | NA | 9.0 | |
| B6 | −0.4 | Spots/liftoff | 1.9 | 0.3 | −3.6 | 0 |
| A5 | −0.4 | 0? | 9.5 | −1.4 | 0.8 | |
| E13 | 0.3 | 1.7 | 1.0 | −0.1 | −1.4 | |

This new chemistry has been developed in order to be compatible with low-k dielectric materials. Because of the introduction of SiLK, special efforts were made to study the particular compatibility of solution B6 with this material. FIG. 34 shows the FT-IR spectrum of the material as deposited (reference), and after treatment in solution B6 (processed at 50° C. for an extended period of 30 minutes). As shown in the graph, no structural change of the material through processing is observed.

Similarly, the change in the dielectric constant of SiLK was followed by the mercury probe method. The mercury probe measures the capacitance of the dielectric between a mercury droplet and the bulk silicon. The dielectric constant is calculated from the equation:

$$C_{ox} = e_o e_r A/t,$$

in which:

$C_{ox}$=measured capacitance, $e_o$=dielectric constant of vacuum, $e_r$=real dielectric constant [or k], A=surface area of the mercury droplet, t=thickness of the dielectric.

After processing in solution B6 there is no noticeable change in the dielectric constant from its initial value of 2.7.

By sweeping the voltage, the C(V) curve gives an indication of the behavior of the dielectric under stress conditions. The C(V) curve in FIG. 35 shows that the material is not modified, as no hysteresis is induced in the material by processing in solution B6.

Tests on patterned SiLK (FIGS. 36-37) corroborate the blanket SiLK data, as no change in the morphology (e.g., bowing) is observed between the before treatment sample (FIG. 36) and the after treatment sample (FIG. 37). Again, solution B6 was used in the SEMITOOL apparatus at 50° C. for 10 min.

The recent introduction of copper as the new interconnect material challenges standard processing and requires new strategies. Etching and cleaning steps need to be redesigned in coordination with each other for optimum results. This invention deals with one of the problems encountered during etching: creating residues difficult to remove by any traditional cleaning treatment. The new etching strategy consists of a "2-step etch" process, in which a protecting layer helps to deal with easier to remove residues. A new chemistry has been developed in order to deal with the results of this process flow. This new chemistry, exemplified by solution B6, efficiently cleans post etch residues containing copper, without damaging the metal and with perfect compatibility with SiLK.

3. Photoresist Stripping:

The invention has been tested to remove photoresist and other polymeric materials on a sample covered with such. The sample in this example is a dual damascene structure etched in a double layer of TEOS. The solutions reported in table 4 were successful in attacking the photoresist in various degrees:

a concentrated choline hydroxide solution (A5) successfully removed the photoresist (FIGS. 11-12);

solutions of other choline types, even at low concentration (for example 10% choline chloride [D2], or 3% choline bicarbonate [D20]) have a non-negligible effect at thinning down the photoresist (FIGS. 13-14);

solutions containing low concentration (2.3% in our example) of choline hydroxide mixed with other solvents such as, for example, dimethyl sulfoxide (DMSO) (solution D4) or monoethanolamine (MEA) (solution D6) have a lift off effect on the photoresist (FIGS. 15-16);

solutions of choline (hydroxide, chloride, or bicarbonate) can remove the photoresist at high concentrations.

TABLE 4

Photoresist removal evaluation

| Solution | Temperature | Time | Stripping Result | |
|---|---|---|---|---|
| A5 | 65° C. | 15 min | P/R removed | FIG. 12 |
| D2 | 65° C. | 15 min | P/R attacked | FIG. 13 |
| D20 | 65° C. | 15 min | P/R attacked | FIG. 14 |
| D4 | 65° C. | 15 min | P/R lift off | FIG. 15 |
| D6 | 65° C. | 15 min | P/R lift off | FIG. 16 |

The addition of a small amount of hydroxylamine in the base solution increases the removal efficiency while keeping the solution compatible with copper. Table 5 shows the results on sample 2, consisting of blanket SiLK film (organic low-k dielectric) with patterned silicon dioxide. The results show that these chemistries can effectively remove the organic resist without damaging the organic dielectric.

TABLE 5

Resist removal results on sample 2 (SiLK ™/SiO2) and copper compatibility of some chemistries

| | Composition | | | | Stripping Results | Com- |
|---|---|---|---|---|---|---|
| Solution | Hydroxyl amine | Solvent | Base | Water | SiLK/Hard Mask | patibility Copper |
| FI | 0% | 50% | 25% | 25% | ▼ | π |
| F2 | 0% | 50% | 50% | | ▼ | X |
| F3 | 2% | 48% | 12% | 38% | ▼ | π |
| F4 | 5% | 45% | 12% | 38% | π | π |
| F5 | 5% | 48% | 47% | | ▼ | π |
| F6 | 5% | | 5% | 90% | ▼ | π |
| F7 | 5% | | 12% | 83% | π | π |
| F8 | 5% | | 24% | 71% | π | π |
| F9 | 5% | 95% | | | ▼ | π |
| F10 | 5% | 50% | | 45% | ▼ | π |
| E11 | 5% | 48% | 24% | 23% | π | π |
| F12 | 10% | 40% | 12% | 38% | π | π |
| F13 | 13% | 37% | 12% | 38% | π | X |
| F14 | 15% | 35% | 12% | 38% | π | X |
| F15 | 20% | 50% | 30% | | ▼ | X |
| F16 | 25% | | 12% | 63% | π | X |
| F17 | 30% | | 46% | | □ | X |
| F18 | 40% | | 60% | | ▼ | X |
| F19 | 50% | | 12% | 38% | π | X |
| F20 | 50% | | 12% | 38% | π | X |

π Good
▼ Incomplete
□ Not Tested
X Incompatible

Solvents can be dimethyl acetamide (DMAc), DMSO, propylene glycol (PG), dipropylene glycol monomethyl ether (DPM), N-methyl pyrrolidone (NMP), or cyclohexyl pyrrolidone (CHP), while the bases consist of morpholine, MEA, diethanolamine, diglycolamine, choline bicarbonate, tetramethyl ammonium hydroxide (TMAH), or choline hydroxide.

A chemistry composed of 2% to 12% of hydroxylamine with a strong base such as a quaternary ammonium hydroxide compound can be used to remove tough resist on inorganic substrate with an organic material exposed. The chemistry is compatible with both copper and the organic material.

4. Residue Removal After Metal Etch:

The invention has been tested for removing polymer after metal etch. The metal etched in our example is an aluminum line, with post etch residues (FIG. 17) relatively easy to clean. A dilute solution of choline bicarbonate (3% [D20] to 5% [D21]) successfully removes this polymer at room temperature, with treatment for about 5 minutes (table 6 and FIG. 18). However we anticipate that tougher residues will require either higher temperature or higher concentration of the solution to be removed efficiently. Either way, care is required to maintain compatibility with the aluminum or aluminum alloy line.

TABLE 6 efficiency of post etch residue removal after metal etch

| Solution | Temperature | time | Cleaning Results | |
|---|---|---|---|---|
| D20 | 25° C. | 5 min | good | FIG. 18 |
| D21 | 25° C. | 5 min | good | no figure |

5. Residue Removal After Via Etch:

TABLE 7 efficiency of post via etch residues removal.

| Solution | Temperature | time | Cleaning Results | |
|---|---|---|---|---|
| D4 | 65° C. | 15 min | Good | no figure |
| D5 | 65° C. | 15 min | Good | no figure |
| D6 | 65° C. | 15 min | Good | no figure |
| D7 | 65° C. | 15 min | Good | no figure |
| D8 | 65° C. | 15 min | Good | no figure |
| D9 | 65° C. | 15 min | Good | no figure |

The invention has been tested for removing polymer after via etch. Dilute solutions of choline hydroxide (2% to 5%) with or without added solvents, such as, for example DMSO (solutions D4 and D5) or MEA (solutions D6 and D7) successfully clean residues from via samples (table 7). Those solutions give good results at cleaning dielectric substrate, but underlying aluminum lines are subject to attack due to the higher temperature used here.

6. Corrosion of Misaligned Tungsten Plug:

The invention has been tested on a sample where misaligned tungsten plugs are corroded by conventional amine cleaner (FIG. 19). We can successfully clean the sample without damaging the plug by using a dilute solution of choline bicarbonate (3% [D20] to 5% [D21]) as a rinse at room temperature for about 5 minutes prior to using the conventional amine cleaner (FIGS. 20 and 21). Furthermore we show in FIG. 22 that adding a small amount (3%) of choline bicarbonate into the conventional cleaner slows down the attack of the exposed plug by the conventional amine system. The use of those solutions as an intermediate rinse between the photoresist removal step and the conventional solvent step avoids corrosion of misaligned tungsten plugs, especially in a case such as the present one where the post metal etch residue is relatively easy to remove.

TABLE 8

Evaluation of tungsten plug corrosion

| Solution | Temperature | Time | line corrosion | plug corrosion | |
|---|---|---|---|---|---|
| D20 | Rt | 5 min | no corrosion | no corrosion | FIG. 20 |
| D21 | Rt | 5 min | no corrosion | no corrosion | FIG. 21 |
| D26 | 65° C. | 15 min | no corrosion | reduced attack | FIG. 22 |

Solution Summary:

| Solution | choline hydroxide concentration | water concentration |
|---|---|---|
| A1 | 0% | 100% |
| A2 | 5% | 95% |
| A3 | 10% | 90% |
| A4 | 20% | 80% |
| A5 | 50% | 50% |

| Solution | choline hydroxide concentration | water concentration | Propylene Glycol concentration |
|---|---|---|---|
| B1 | 15% | (70 + 15)% | 0% |
| B2 | 20% | (60 + 20)% | 0% |
| B3 | 25% | (50 + 25)% | 0% |

| Solution | choline hydroxide concentration | water concentration | Propylene Glycol concentration | Other (Benzotriazole) |
|---|---|---|---|---|
| C1 | 20% | (20 + 20)% | 40% | |
| C2 | 10% | (30 + 10)% | 50% | |
| C3 | 10% | (79 + 10)% | | 1% BTA |
| C4 | 10% | (29 + 10)% | 50% | 1% BTA |
| C6 | 20% | (20 + 59.5)% | | 0.5% BTA |

| Solution | TMAH concentration | Water concentration | Propylene Glycol concentration | Propylene Carbonate |
|---|---|---|---|---|
| C8 | 25% | 75% | | |
| C9 | 12.50% | 12.50% | 50% | |
| C10 | 12.50% | 12.50% | | 50% |

| Solution | Choline hydroxide | Choline bicarbonate | Choline chloride | Water | Solvent(s) | corr. inhib. |
|---|---|---|---|---|---|---|
| D2 | | | | 10% | 90% | |
| D3 | | | | 20% | 80% | |
| D4 | 2.30% | | | 47.70% | 50% DMSO | |
| D5 | 1.19% | | | 45.32% | 47.5% DMSO | 5% cat |
| D6 | 2.30% | | | 47.70% | 50% MEA | |
| D7 | 1.19% | | | 45.32% | 47.5% MEA | 5% cat |
| D8 | 4.60% | | | 95.40% | | |
| D9 | 4.37% | | | 90.63% | | 5% cat |
| D10 | 4.60% | | | 94.90% | | 0.5% BTA |
| D11 | 4.60% | | | 94.40% | | 1% TBC |
| D12 | 4.60% | | | 90.40% | | 5% TBC |
| D13 | 2.50% | | | 97.50% | | |
| D14 | 20% | | | 30% | 50% PG | |
| D15 | 10% | | | 40% | 50% PG | |
| D16 | 2% | | | 48% | 50% PG | |
| D17 | 20% | | | 20% | 60% PG | |
| D18 | 12.50% | | | 12.50% | 75% PG | |
| D19 | | 75% | | 25% | | |
| D20 | | 3% | | 97% | | |
| D21 | | 5% | | 95% | | |
| D22 | | 37.50% | | 12.50% | 50% PG | |
| D23 | | 18.75% | | 56.25% | 25% PG | |
| D24 | | 3.75% | | 46.25% | 50% PG | |
| D25 | | 3.75% | | 1.25% | 95% PG | |
| D26 | 2% | | | 17.15% | 17.15% HYDROXY-LAMINE; 58.8% DGA | 4.9% cat |

-continued

| Solution | choline hydroxide concentration | water concentration | Propylene Glycol concentration |
|---|---|---|---|
| B4 | 20% | (10 + 20)% | 50% |
| B5 | 20% | (35 + 20)% | 25% |
| B6 | 25% | 25% | 50% |

| Solution | Composition | Name |
|---|---|---|
| E1 | NMP | N-methyl pyrrolidone |
| E2 | BLO | gamma butyrolactone |
| E3 | DPM acetate | Dipropyleneglycol monomethyl ether |
| E4 | morpholine | |
| E5 | DGA | Diglycol amine |
| E6 | 85% BLO + 15% NMP | |
| E7 | 50% DGA + 50% NMP | |
| E8 | 50% Morpholine + 35% NMP + 15% BLO | |
| E9 | DPM | |
| E10 | propylene carbonate | |

-continued

| Solution | Composition | Name |
|---|---|---|
| EI1 | DMSO | Dimethyl sulfoxide |
| E12 | DMF | Dimethyl formate |
| EI3 | propylene glycol | |
| E14 | dimethylacetamide | |
| E15 | TETA | Tri(ethylene) tetraamine |
| E16 | TETA + 5% ammonium bicarbonate. | |
| E17 | TETA + 1% ammonium bicarbonate. | |
| E20 | TETA + 5% catechol | |
| E21 | TETA + 1% BTA | Benzotriazole |
| E22 | TEA | Triethanolamine |
| E23 | TEA + 5% ammonium bicarbonate. | |
| E24 | TEA + 1% ammonium bicarbonate. | |
| E27 | TEA + 5% catechol | |
| E28 | TEA + 1% BTA | |
| E29 | MEA | Monoethanolamine |
| E30 | MEA + 5% ammonium bicarbonate. | |
| E31 | MEA + 1% ammonium bicarbonate. | |
| E34 | MEA + 5% catechol | |
| E35 | MEA + 1% BTA | |
| E36 | 8% Citric acid + 3.2% HYDROXYLAM1NE + 0.5% BTA + 88.3% water | | cat = catechol
TBC = t-butyl catechol

In summary, these tests demonstrate a new chemistry, exemplified by composition B6, for example, in the above tables, which has a negligible etch rate on copper and other metal used for copper integration (e.g., FIG. 23). It is perfectly compatible with SiLK and some other low-k materials (e.g., FIG. 24) and at the same time, gently removes residues containing copper as well as photoresists and polymers (e.g., ARC polymers), preferably photoresists and polymers containing somewhere within the molecular structure a carbonyl moiety, a carboxyl moiety, a nitrile moiety, an imide moiety, or a combination thereof, most preferably photoresists and polymers containing a carbonyl moiety.

The present embodiments are to be considered in all respects as illustrative and no restrictive, and all changes which come within the meaning and range of equivalency of the claims are therefore intended to be embraced therein. As would be apparent to those skilled in the art, the invention may be embodied in other specific forms with various changes in form and details of the invention as described herein without departing from the spirit or essential characteristics thereof.

What is claimed is:

1. A method for removing polymer, photoresist or residues or combinations thereof from dual damascene structures using copper materials and low k materials, wherein said process first forms the trench and thereafter forms the via, wherein the dual damascene structure comprises contacting the etch residues with a composition comprising a choline compound, water, and an organic polar solvent that is miscible with water.

2. The method of claim 1 wherein the composition comprises from about 10 percent by weight to about 12 percent by weight of choline hydroxide.

3. The method of claim 2 wherein the composition comprises from about 10 percent by weight to about 80 percent by weight of the water.

4. The method of claim 3 wherein the composition comprises from about 20 percent by weight to about 80 percent by weight of the organic polar solvent.

5. The method of claim 1 wherein the choline compound comprises choline hydroxide, choline bicarbonate or choline chloride.

6. The method of claim 5 wherein the choline compound is choline hydroxide.

7. The method of claim 5 wherein the organic polar solvent comprises N-methyl-pyrrolidone, dimethylsulfoxide, diglycolamine, monoethanolamine, propylene glycol, or a mixture thereof.

8. The method of claim 1 in which the composition additionally comprises hydroxylamine.

9. The method of claim 1 in which the composition additionally comprises a corrosion inhibitor.

* * * * *